United States Patent
Galvin et al.

(10) Patent No.: US 7,875,205 B2
(45) Date of Patent: Jan. 25, 2011

(54) PHOTOVOLTAIC CELL

(75) Inventors: Mary E. Galvin, Titusville, NJ (US); Russell Gaudiana, Merrimack, NH (US); David Waller, Lexington, MA (US); Zhengguo Zhu, Chelmsford, MA (US)

(73) Assignees: Konarka Technologies, Inc., Lowell, MA (US); University of Delaware, Newark, DE (US)

( * ) Notice: Subject to any disclaimer, the term of this patent is extended or adjusted under 35 U.S.C. 154(b) by 36 days.

(21) Appl. No.: 12/261,742

(22) Filed: Oct. 30, 2008

(65) Prior Publication Data
US 2009/0050207 A1    Feb. 26, 2009

Related U.S. Application Data

(62) Division of application No. 11/363,643, filed on Feb. 28, 2006, now Pat. No. 7,466,376.

(60) Provisional application No. 60/664,298, filed on Mar. 22, 2005, provisional application No. 60/664,336, filed on Mar. 23, 2005.

(51) Int. Cl.
*C09K 19/34* (2006.01)
*C09K 19/32* (2006.01)
*H01L 31/00* (2006.01)

(52) U.S. Cl. .................. 252/299.61; 252/299.62; 349/186; 136/206; 136/263

(58) Field of Classification Search ............ 252/299.61, 252/299.62; 349/186; 136/205, 206, 263
See application file for complete search history.

(56) References Cited

U.S. PATENT DOCUMENTS

| | | | |
|---|---|---|---|
| 4,231,808 A | 11/1980 | Tabei et al. | |
| 5,135,581 A | 8/1992 | Tran et al. | |
| 5,158,619 A | 10/1992 | Kawada et al. | |
| 5,176,758 A | 1/1993 | Nath et al. | |
| 5,292,813 A | 3/1994 | Patil et al. | |
| 5,367,051 A | 11/1994 | Narang et al. | |
| 5,741,442 A | 4/1998 | McBranch et al. | |
| 6,281,430 B1 | 8/2001 | Lupo et al. | |
| 6,483,099 B1 | 11/2002 | Yu et al. | |
| 7,466,376 B2 * | 12/2008 | Galvin et al. | 349/84 |
| 2002/0039627 A1 * | 4/2002 | Ichihashi et al. | 428/1.1 |
| 2003/0085397 A1 | 5/2003 | Geens et al. | |
| 2003/0159729 A1 | 8/2003 | Shaheen et al. | |
| 2006/0137740 A1 | 6/2006 | Park et al. | |

OTHER PUBLICATIONS

Alivisatos, "Hybrid Nanorod-Polymer Solar Cell, Final Report, Jul. 19, 1999—Sep. 19, 2002," National Renewable Energy Laboratory, NREL/SR-520-34567, (2003).

Armstrong et al., "Development of Liquid Crystal-Based Photovoltaic Technologies," Conference Proceedings—NCPV Program Review Meeting, Oct. 14-17, 2001, (2001), 328-329.

Bertozzi, "Functional Bone-Like Materials: A Biomimetic Synthetic Approach," Materials Sciences Division LDRD 2001 Annual Report, 1-19, (2001).

(Continued)

*Primary Examiner*—Shean C Wu
(74) *Attorney, Agent, or Firm*—Fish & Richardson P.C.

(57) ABSTRACT

A photovoltaic cell has two electrodes and a hole injection layer. A liquid crystal material and a plurality of particles can be disposed between the electrodes.

19 Claims, 12 Drawing Sheets

OTHER PUBLICATIONS

Brabec et al., "Plastic Solar Cells," Adv. Funct. Mater. 11(1):15-26, (2001).

Cravino et al., "A novel polythiophene with pendant fullerenes: toward donor/acceptor double-cable polymers," Chem. Commun., 2487-2488, (2000).

Cravino et al., "Electrochemical and Photophysical Properties of a Novel Polythiophene with Pendant Fulleropyrrolidine Moieties: Toward "Double Cable" Polymers for Optoelectronic Devices," J. Phys. Chem. B, 106:70-76, (2002).

Cravino et al., "Photoinduced Electron Transfer in Donor/Acceptor Double-Cable Polymers," Electrochemical Society Meeting, 199$^{th}$ Meeting, vol. 2001-1, p. 675, (2001).

Ferraris, et al., "Grafting of buckminsterfullerene onto polythiophene: novel intramolecular donor-acceptor polymers," Opt. Mat., 9:34-42, (1998).

Furtak et al., "Characterization of optical and mechanical modification of surface alignment layers for liquid crystal devices," Proc. SPIE (The International Society for Optical Engineering) 4463:139147, (2001).

Gebeyehu et al., "Characterization of large area flexible plastic solar cells based on conjugated polymer/fullerene composites," Int. J. Photoenergy, 1(1):89-93, (1999).

Hsu et al., "Directed Spatial Organization of Zinc Oxide Nanorods," Am. Chem. Soc., 5(1):83-86, (2005).

Hulvat and Stupp, "Liquid-crystal templating of conducting polymers," Angew. Chem. Int. Ed., 42(7):778-81, (2003).

Huynh et al., "Charge transport in hybrid nanorod-polymer composite photovoltaic cells," Phys. Rev. B, 67:115326(1)-115326(12), (2003).

Ichimura, et al., "Photocontrolled Orientation of Discotic Liquid Crystals," Adv. Mat., 12(13):950-953, (2000).

Kumar, "Discotic liquid crystals for solar cells," Curr. Sci., 82(3):256-257 (2002).

Kumar, "Molecular engineering of discotic nematic liquid crystals," Pramana J. Phys., 61(2): 199-203, (2003).

Liu et al., "Employing end-functional polythiophene to control the morphology of nanocrystal polymer composites in hybrid solar cells," J. Am. Chem. Soc., 126(21):6550-6551 (2004).

Milliron et al., "Electroactive Surfactant Designed to Mediate Electron Transfer Between CdSe Nanocrystals and Organic Semiconductors," Adv. Mater., 15(1):58-61, (2003).

New Hybrid Solar Cells Combine Nanotech With Plastics, Mar. 29, 2002, http://www.cchem.berkeley.edu/editor/Publications/news/spring2002/solarcells.htm.

Padinger et al., "Effects of Postproduction Treatment on Plastic Solar Cells," Adv. Funct. Mater., 13(2):1-4, (2003).

Scher et al., "Shape control and applications of nanocrystals," Philos. Transact. A Math Phys Eng Sci. 361:241-55; discussion 256-257, (2003).

Shaheen et al., "Polymer Based Nanostructured Donor-Acceptor Heterojunction Photovoltaic Devices, National Center for Photovoltaics and Solar Program Review Meeting Proceedings, Mar. 24-26, 2003," National Renewable Energy Laboratory, NREL/CP-520-33597, (2003).

Tian et al., "Complex and oriented ZnO nanostructures," Nat. Mater., (12):821-6 (2003), Epub. Nov. 23, 2003.

Wang, "Nanostructures of zinc oxide," Materials Today, 26-33 (2004).

Wormser et al., "Polymer Photovoltaics—Challenges and Opportunites," National Center for Photovoltaics and Solar Program Review Meeting Proceedings, 307-310, (2003).

Yin et al., "Zinc oxide quantum rods," J. Am. Chem. Soc. 126(20):6206-6207, (2004).

* cited by examiner

PHOTOVOLTAIC CELL

CROSS REFERENCE TO RELATED APPLICATIONS

Pursuant to 35 U.S.C. §102, this application is a divisional application of co-pending U.S. patent application Ser. No. 11/363,643, filed Feb. 28, 2006. Pursuant to 35 U.S.C. §119 (e), U.S. patent application Ser. No. 11/363,643 claims priority to U.S. Provisional Application Ser. No. 60/664,298, filed Mar. 22, 2005, and to U.S. Provisional Application Ser. No. 60/664,336, filed Mar. 23, 2005. The contents of these applications are hereby incorporated by reference.

STATEMENT REGARDING FEDERALLY SPONSORED RESEARCH

This invention was made with Government support under Contract Number W911 QY-04-C-0070 awarded by the Department of the Army. The Government has certain rights in the invention.

TECHNICAL FIELD

The invention relates to photoactive layers that contain liquid crystal materials, as well as related photovoltaic cells, systems and methods.

BACKGROUND

Photovoltaic cells, sometimes called solar cells, can convert light, such as sunlight, into electrical energy.

SUMMARY

The invention relates to photoactive layers that contain liquid crystal materials, as well as related photovoltaic cells, systems and methods.

In one aspect, the invention relates to a photovoltaic cell including a first electrode and a second electrode. A hole injection layer, a liquid crystal (LC) material, and a plurality of particles in electrical contact with the liquid crystal material are disposed between the first and second electrodes.

In some embodiments, the particles are inorganic particles. The particles may be elongated.

In some embodiments, a plurality of surface groups is bound to at least some of the particles. The particle surface groups may be electroactive. The particle surface groups can increase an ability of the LC material to wet the particles.

In some embodiments, at least some of the particle surface groups include a plurality of aromatic rings. At least some of the particle surface groups can include a plurality of 5-membered rings. At least some of the 5-membered rings can include at least one sulfur atom. At least some of the particle surface groups can include at least one sulfoxide group. In some embodiments, one of the 5-membered rings of at least some of the particle surface groups is a terminal 5-membered ring and only the terminal 5-membered ring includes a sulfoxide group.

In some embodiments, at least some of the particle surface groups include at least one aromatic ring having an aliphatic chain of at least 3 carbon atoms.

In some embodiments, the LC material is an electroactive LC material. The LC material can be a nematic LC material. The nematic LC material can be a discotic nematic LC material.

In some embodiments, the LC material includes a plurality of LC units and at least some of the LC units are in different layers of the LC material. The positions of the LC units in different layers may be substantially random.

In some embodiments, the liquid crystal material defines a director (e.g., a layer director) and the particles define a major axis longer than a minor axis of the particles. The director and the major axes of substantially all the particles may be substantially aligned.

In some embodiments, the liquid crystal material defines a director (e.g., a layer director) and the hole injection layer comprises a plurality of polymer rods in contact with the liquid crystal material. The director and substantially all of the polymer rods may be substantially aligned.

In some embodiments, the liquid crystal material includes a plurality of discotic LC units and each LC unit has an aromatic central group and at least 4 electroactive arms. The aromatic central group can include at least 2 fused aromatic 6-membered rings and at least 4 heterocyclic rings fused to the aromatic 6-membered rings. The aromatic central group can include at least 3 fused aromatic 6-membered rings. At least some of the heterocyclic rings may be 5-membered rings having a sulfur atom. The electroactive arms can include a plurality of 5-membered rings. At least some of the 5-membered rings can include a sulfur atom. At least one of the 5-membered rings of each electroactive arm can include an aliphatic chain having at least 3 carbon atoms.

In some embodiments, the LC material includes or is formed entirely of LC units that are free of metal atoms.

In some embodiments, a photoactive binder is dispersed among the liquid crystal material. The photoactive binder can include a polymer that has a LUMO similar to a LUMO of the LC material. The photoactive binder can be a polymer that has a HOMO similar to a HOMO of the LC material.

In some embodiments, the first electrode is a mesh electrode.

In some embodiments, the particles are formed of a material selected from the group consisting of ZnO, WO3, and TiO2. The particles may be elongated and with a first end of at least some of the particles fixed with respect to one of the electrodes and a second end of the at least some of the particles free of the electrode.

Another aspect of the invention relates to a method for manufacturing a photovoltaic cell. In some embodiments, the method includes disposing a hole injection material, a plurality of particles, at least some of which have a particle surface group associated therewith, and a plurality of liquid crystal (LC) units between first and second electrodes.

In some embodiments, the method includes forming a discotic nematic LC material including the LC units. Forming the discotic nematic LC material can include forming a layer of the hole injection material, the layer having a surface, associating a surfactant with a surface of the layer of the hole injection material, and contacting the surfactant with the LC units.

Another aspect of the invention relates to discotic nematic liquid crystal (LC) material. In some embodiments, the LC material includes a plurality of LC units, with each LC unit having a central moiety comprising at least one aromatic ring and a plurality of electroactive arms extending outward from the central moiety, each arm comprising a plurality of cyclic groups at least some of which comprise at least one sulfur atom.

Other features and advantages will be apparent from the description, drawings, and claims.

DESCRIPTION OF DRAWINGS

Like reference symbols in the various drawings indicate like elements.

DETAILED DESCRIPTION

Figure 1:
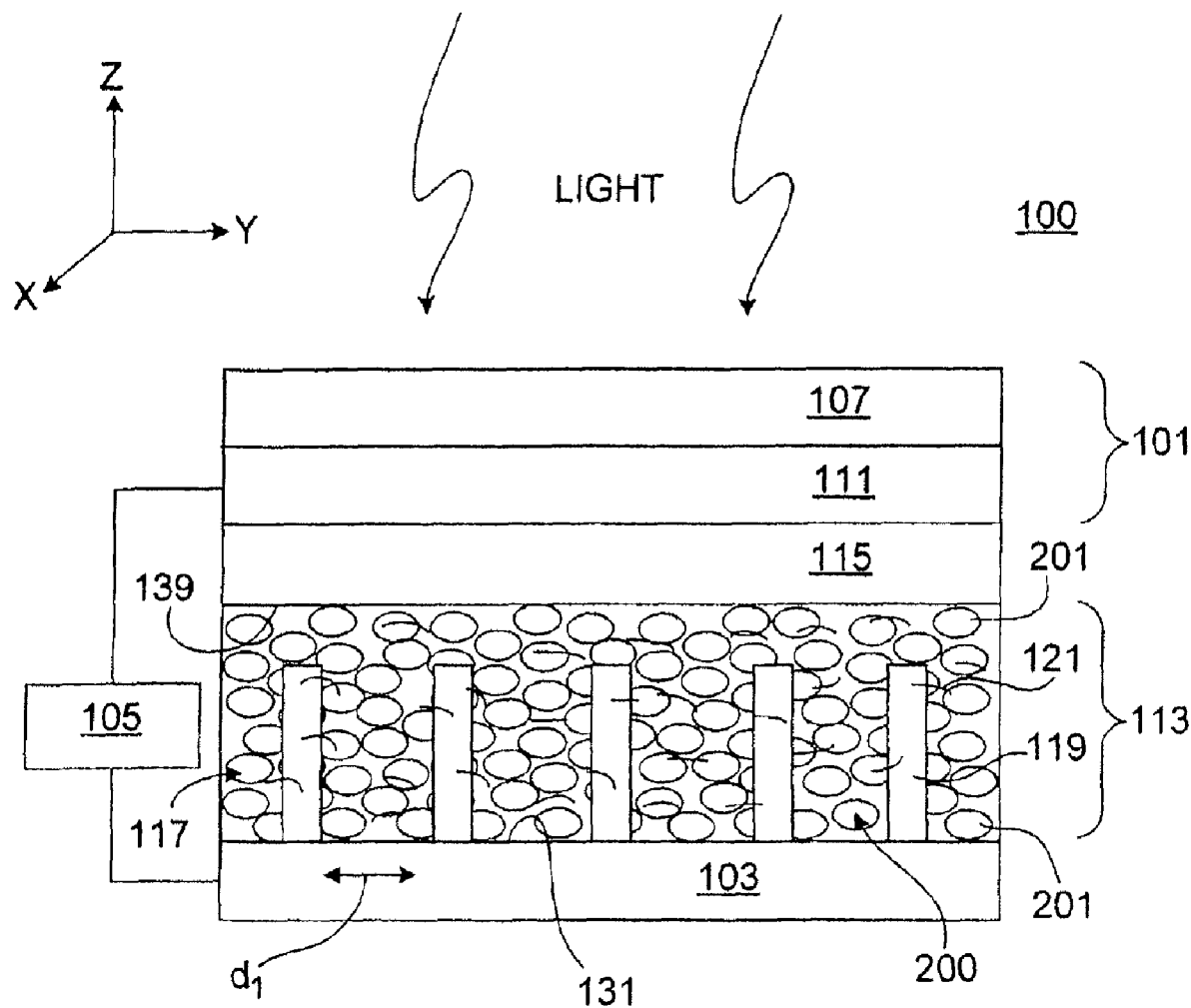
FIG. 1 is a cross-sectional view of an embodiment of a photovoltaic cell.

FIG. 1 shows a photovoltaic cell 100 that includes an electrode 101 and a counterelectrode 103 that are electrically connected to an external load 105. Electrode 101 includes a substrate 107 and an electrically conductive layer 111. Photovoltaic cell 100 also includes a photoactive layer 113 and a hole injection layer 115 disposed between electrode 101 and counterelectrode 103.

Photoactive layer 113 includes a semiconductor material and an electroactive liquid crystal (LC) material 200. The semiconductor material is formed of particles 119 of the semiconductor material. Electroactive LC material 200 is formed of a plurality of LC units 201. Photoactive layer 113 further includes a plurality of particle surface groups 121, at least some of which are associated with (e.g., physically and/or chemically sorbed to and/or bound to) particles 119 of the semiconductor material. Photoactive layer also includes a photoactive binding material 117 disposed between particles 119 and LC units 201.

During operation, in response to illumination by radiation (e.g., light in the solar spectrum), photovoltaic cell 100 produces a flow of electrons across load 105. The illuminating radiation is absorbed by and produces excitons within the electroactive LC material 200, photoactive binding material 117, and/or particle surface groups 121. The excitons migrate through the LC material 200, binding material 117, and/or particle surface groups 121 to particles 119. At the particles, electron transfer occurs when an electron from an exciton is transferred to a particle leaving behind a hole within the surrounding photoactive layer. Electrons pass into the conduction band of the particles, flow through the particles to counter electrode 103, and then to external load 105. After flowing through external load 105, the electrons flow to electrode 111, to layer 115, and then return to photoactive layer 113. Holes generated by the electron transfer at the particles migrate, e.g., by electron exchange, through photoactive layer 113 to hole injection layer 115, where the holes can recombine with electrons returning to photoactive layer 113. Electron transfer and electron-hole recombination occurs continuously during illumination so that photovoltaic cell 100 can provide continuous electrical energy to external load 105.

Figure 2:
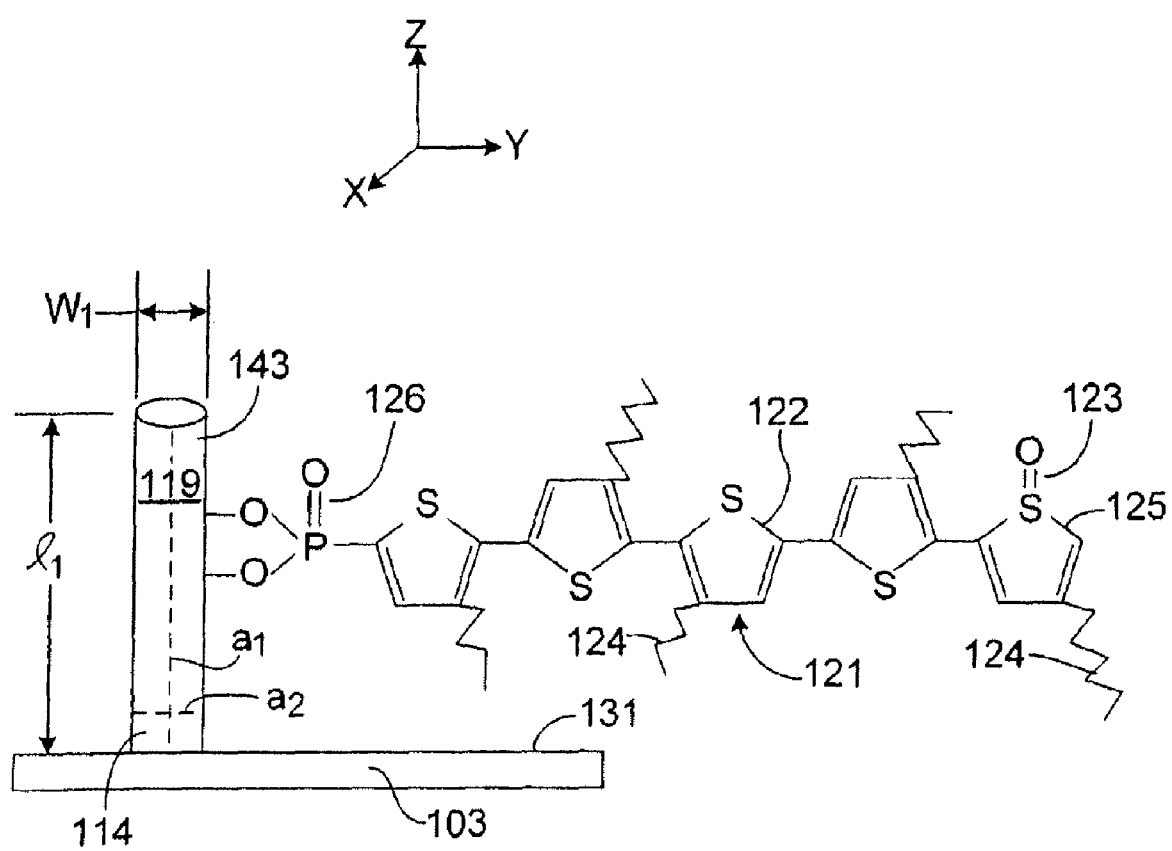
FIG. 2 is a partial cross-sectional view of the photovoltaic cell of FIG. 1.

Referring also to FIG. 2, particles 119 define a major axis $a_1$ and a minor axis $a_2$ (i.e., the particles are elongated). In some embodiments, the average length $l_1$ of the particles along major axis $a_1$ is at least about 100 nanometers (e.g., at least about 200 nanometers, at least about 250 nanometers, at least about 350 nanometers). In certain embodiments, the average length $l_1$ is at most about 1000 nanometers (e.g., at most about 750 nanometers, at most about 500 nanometers, at most about 400 nanometers, at most about 300 nanometers). In some embodiments, the average width $w_1$ of the particles along minor axis $a_2$ is at least about 2 nanometers (e.g., at least about 3 nanometers, at least about 5 nanometers, at least about 7 nanometers). In certain embodiments, the average width $w_1$ is at most about 50 nanometers (e.g., at most about 35 nanometers, at most about 25 nanometers, at most about 15 nanometers, at most about 10 nanometers). For example, in certain embodiments, the particles can have an average length $l_1$ of from about 100 nanometers to about 600 nanometers (e.g., from about 200 nanometers to about 500 nanometers) and an average width $w_1$ of from about 2.5 to about 50 nanometers (e.g., from about 5 nanometers to about 20 nanometers).

Particles 119 have a free end 143 and a fixed end 141, which is fixed with respect to a surface 131 of counterelectrode 103. Major axes $a_1$ of particles 119 are aligned at least in part along a common axis, which is oriented normal to inner surface 131. For example, as seen in FIG. 2, major axes $a_1$ of particles 119 are generally aligned with the z-axis while inner surface 131 occupies an x-y plane normal to the z axis. Without being bound by theory, it is believed that such orientation facilitates electron transfer along particles 119 to counterelectrode 103.

In some embodiments, the average distance $d_1$ (FIG. 1) between the major axes $a_1$ of nearest particles is at most about 150 nanometers (e.g., at most about 100 nanometers, at most about 75 nanometers, at most about 50 nanometers, at most about 35 nanometers, at most about 10 nanometers). Without wishing to be bound by theory, it is believed that average distances of about 50 nanometers or less (e.g., of about 20 nanometers or less) enhance the efficiency of exciton transfer within photoactive layer 113 by reducing the likelihood that an exciton will be quenched before reaching the particles.

Examples of semiconductor materials from which particles 119 can be formed can have the formula $M_xO_y$, where M may be, for example, titanium, zirconium, zinc, tungsten, niobium, lanthanum, tantalum, terbium, or tin and x is greater than zero (e.g., an integer greater than zero) and y is greater than zero (e.g., an integer greater than zero). Additional examples of semiconductor materials from which the elongated particles can be formed include sulfides, selenides, tellurides, and oxides of titanium, zirconium, niobium, lanthanum, tantalum, terbium, tin, zinc or combinations thereof. For example, $TiO_2$, $SrTiO_3$, $CaTiO_3$, $ZrO_2$, $WO_3$, $La_2O_3$, $Nb_2O_5$, $SnO_2$, ZnO, sodium titanate, cadmium selenide (CdSe), cadmium sulphides, and potassium niobate may be suitable materials.

Semiconductor materials from which particles 119 can be formed can exhibit electron mobilities of at least about $1\times10^{-3}$ cm$^2$V$^{-1}$s$^{-1}$ (e.g., at least about $10^2$ cm$^2$V$^{-1}$s$^{-1}$).

While particles 119 are shown as elongated along a major axis, the particles may have other shapes. For example, the particles may be curved, fibrous, branched, or spherical. In some embodiments, the particles may be tubular or shell-like.

In general, particles 119 can be prepared as desired. Examples of preparation methods include templated synthesis, direct synthesis of an array of oriented particles, and hydrothermal synthesis.

Typically, templated synthesis includes growing particles 119 from a surface that has a plurality of nucleation sites, which are generally formed of the same material as particles 119. For example, nucleation sites to grow ZnO particles can be prepared as follows. ZnO nanoparticles (Alfa Aesar, Ward Hill, Mass.) are dispersed in a solvent (e.g., water). The nanoparticles can have an average diameter of from about 10 nm to about 100 nm (e.g., from about 25 nanometers to about 75 nanometers). A dispersant (e.g., a polyacrylic-based dispersant) is added to the nanoparticles to form a suspension. The suspension is mixed and centrifuged to remove agglomerated nanoparticles. The centrifuged suspension is applied as a thin coating to a conductive surface (e.g., the surface 131 of counterelectrode 103). The coating is dried (e.g., in air at room temperature) to produce a plurality of ZnO nucleation sites on the surface of the substrate.

In some embodiments, the conductive surface is formed of a metal (e.g., copper, aluminum, titanium, indium, or gold). For example, the conductive surface can be the surface of a metal foil. In certain embodiments, the surface is a metal oxide, such as indium tin oxide (ITO), tin oxide, a fluorine-doped tin oxide, and zinc-oxide. The oxide surface can be supported by, for example, a metal foil or a polymer.

To prepare particles 119, the nucleation sites are contacted with an aqueous solution of zinc (e.g., as $Zn(NO_3)_2$) and an amine (e.g., hexamethyltetramine (HMT)). Typically, the zinc concentration is from about 0.005 to about 0.08 M (e.g., from about 0.01 to about 0.05 M). Typically, the HMT concentration is from about 0.0005 M to about 0.005 M (e.g., from about 0.001 M to about 0.002 M). The solution is allowed to react with the nucleation sites for a period of time sufficient to grow oriented ZnO particles. In general, the time is from about 24 hours to about 96 hours (e.g., from about 48 hours to about 80 hours, such as about 72 hours). In general, the temperature is from about 40° C. to about 80° C. (e.g., from about 50° C. to about 70° C., such as about 60° C.). The resulting particles 119 can be washed (e.g., by rinsing with a solvent such as water) to remove unreacted zinc and amine. The particles are oriented with respect to the surface (e.g., with respect to surface 131 of counterelectrode 103 as seen in FIG. 1).

We turn next to particle surface group 119. In some embodiments, the particle surface group can modify (e.g., increase) the ability of the photoactive material to wet particles 119. Alternatively, or in addition, the particle surface groups can enhance charge conduction between the LC material and photoactive binder and particles 119. As seen in FIG. 2, particle surface group 121 is formed of a conducting polymer 122, a light absorption modifier 123, a plurality of pendent solubilizing groups 124, and a binding group 126.

In general, conducting polymer 122 includes a plurality of units. In FIG. 2, conducting polymer 122 is a polythiophene polymer having 5 units (e.g., thiophene rings). In some embodiments, conducting polymer 122 includes fewer units (e.g., 2 units, 3 units or 4 units). In certain embodiments, conducting polymer 122 includes more than 5 units (e.g., 6 units, 7 units, 8 units, 9 units, 10 units, or more).

Figure 3A:
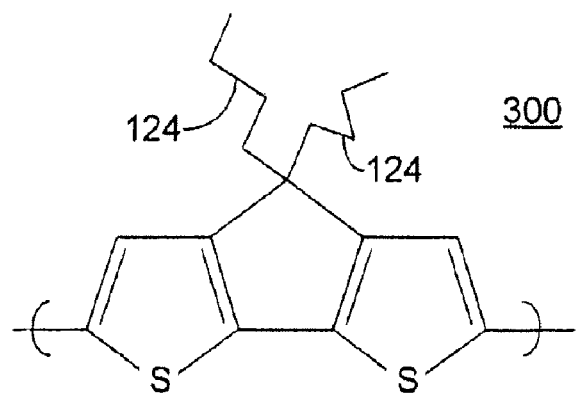
FIGS. 3A-3B illustrate embodiments of units of conducting polymers of photoactive material.
Figure 3B:
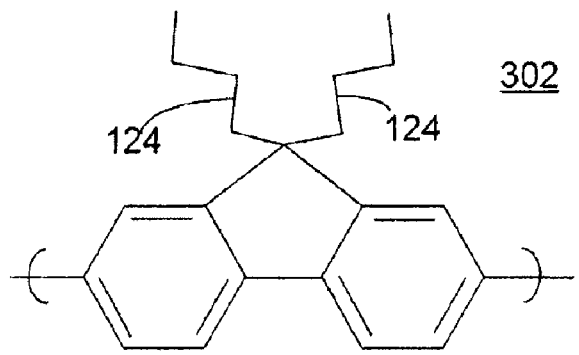
Figure 3C:
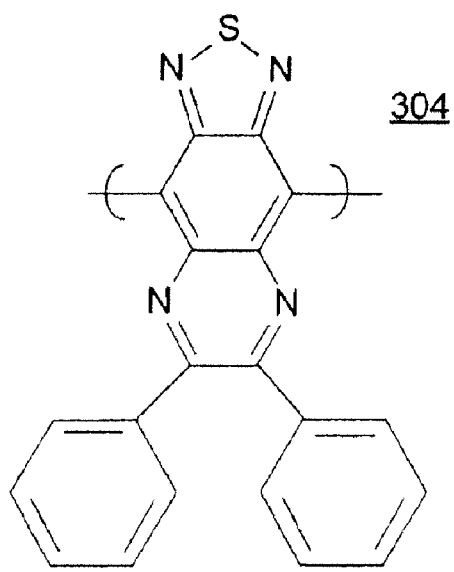

Additional examples of units from which the conducting polymers can be formed are shown in FIGS. 3A-3C. In FIG. 3A, a unit 300 includes a pair of thiophene rings that define a third ring between them. A pair of pendent solubilizing groups extend from the third ring. In FIG. 3B, a unit 302 includes a pair of phenyl groups that define a third ring between them. In FIG. 3C, a unit 304 includes a plurality of pendent heterocyclic and phenyl groups.

Further examples of conducting polymers from which the particle surface groups can be formed include polyaniline (Pan), poly(N-vinycarbazole) (PVCZ), polyacetylene (PA), polypyrole (PPy), poly(2-vinylpyridine) (P2VP), and poly(p-phenylenevinylene) (PPV) and other polyphenylenes, poly (3-hexylthiophene), polyphenylacetylene, polydiphenylacetylene, oligothiophenes, and combinations thereof. Derivatives of such conducting polymers can also be used. For example, bridged thiophenes having two thiophene polymers linked together by a bridging group can be used. In some embodiments, the particle surface groups are LC units, such as units of a discotic nematic liquid crystal material as discussed below.

In general, conducting polymer 122 is able to transfer electrons along at least a portion of its length (e.g., between LC material 200 and particles 119). In some embodiments, the energy level of the lowest unoccupied molecular orbital (LUMO) of the particle surface group is higher than the energy of the conduction band of particles 119. Without wishing to be bound by theory, it is believed that the higher LUMO of the particle surface group can enhance electron transfer from the particle surface group to the particles. Hence, particle surface group 121 can increase the performance of cell 100 and/or can facilitate (e.g., enhance) electron transfer from LC material 200 and/or photoactive binder 117 to particles 119.

Light absorption modifier 123 is a sulfoxide group that shifts the range of light absorbed by the particle surface group 121 to longer wavelengths. This shift increases the amount of visible solar radiation absorbed by the particle surface group 121. For example, particle surface group 121 with the sulfoxide group has an absorption maximum between about 500 nanometers and about 600 nanometers, which range is about 50 nanometers to about 100 nanometers higher than if the sulfoxide group were not present.

In FIG. 2, the light absorption modifier is located on the terminal thiophene ring 125. In certain embodiments, some or all of the other units (e.g., some or all of the other thiophene rings) of particle surface group 121 may also or alternatively include a light absorption modifier. In some embodiments, no light absorption modifier is present.

Solubilizing groups 124 can enhance the solubility of particles surface group 121 with respective the photoactive material of layer 113. As shown in FIG. 2, solubilizing groups 124 are alkyl chains. At least some (e.g., all) units of particle surface group 121 include a respective pendent alkyl chain. In general, at least some (e.g., all) of the pendent groups are alkyl chains at least 3 atoms long (e.g., at least 4 atoms long, at least 5 atoms long, at least 6 atoms long, or more). At least some (e.g., all) of the atoms may be carbon atoms. Other solubilizing groups can be used. Examples of other solubilizing groups include branched alkyl groups, alkoxy groups, cyano groups, amino groups, and/or hydroxy groups. As seen in FIGS. 3A and 3B, each unit of a particle surface group can have more than one (e.g., 2, 3, or more) solubilizing groups.

Binder group 126 associates particle surface group 121 with its particle 119. Binder group 126 includes a phosphonic acid group having a high affinity for the semiconductor material of particle 119. Without wishing to be bound by theory, it is believed that the phosphonic acid group allows (e.g., does not substantially inhibit) efficient electron transfer between conducting polymer 122 and particle 119.

Particles 119 can include a plurality of particle surface groups. In some embodiments, the average number of particle surface groups per particle is at least about 10 (e.g., at least about 1000, at least about 5,000, at least about 10,000). In some embodiments, at least about 10% (e.g., at least about 25%, at least about 50%, at least about 75%) of the particle surface area is covered by surface groups. For example, in some embodiments, a surface area of the particles is between about 75 and 80 $m^2$/g and surface groups 121 are present at about 60 mg surface group per gram particle, which corresponds to about 60% coverage of the particle surface. In some embodiments, the particles surfaces are completely covered.

In general, particle surface group 121 can be prepared as desired. Typically, a polythiophene polymer is polymerized from halogenated thiophene monomers that are substituted with a pendent solubilizing group. The binder group is added to the polythiophene polymer. Typically, the method for adding the binder group includes brominating the polythiophene polymer and converting the bromine to a phosphonate (e.g., a phosphonate ester) by a nucleophilic displacement reaction. The phosphonate is transformed into the phosphonic acid to provide particle surface group 121.

Figure 7:
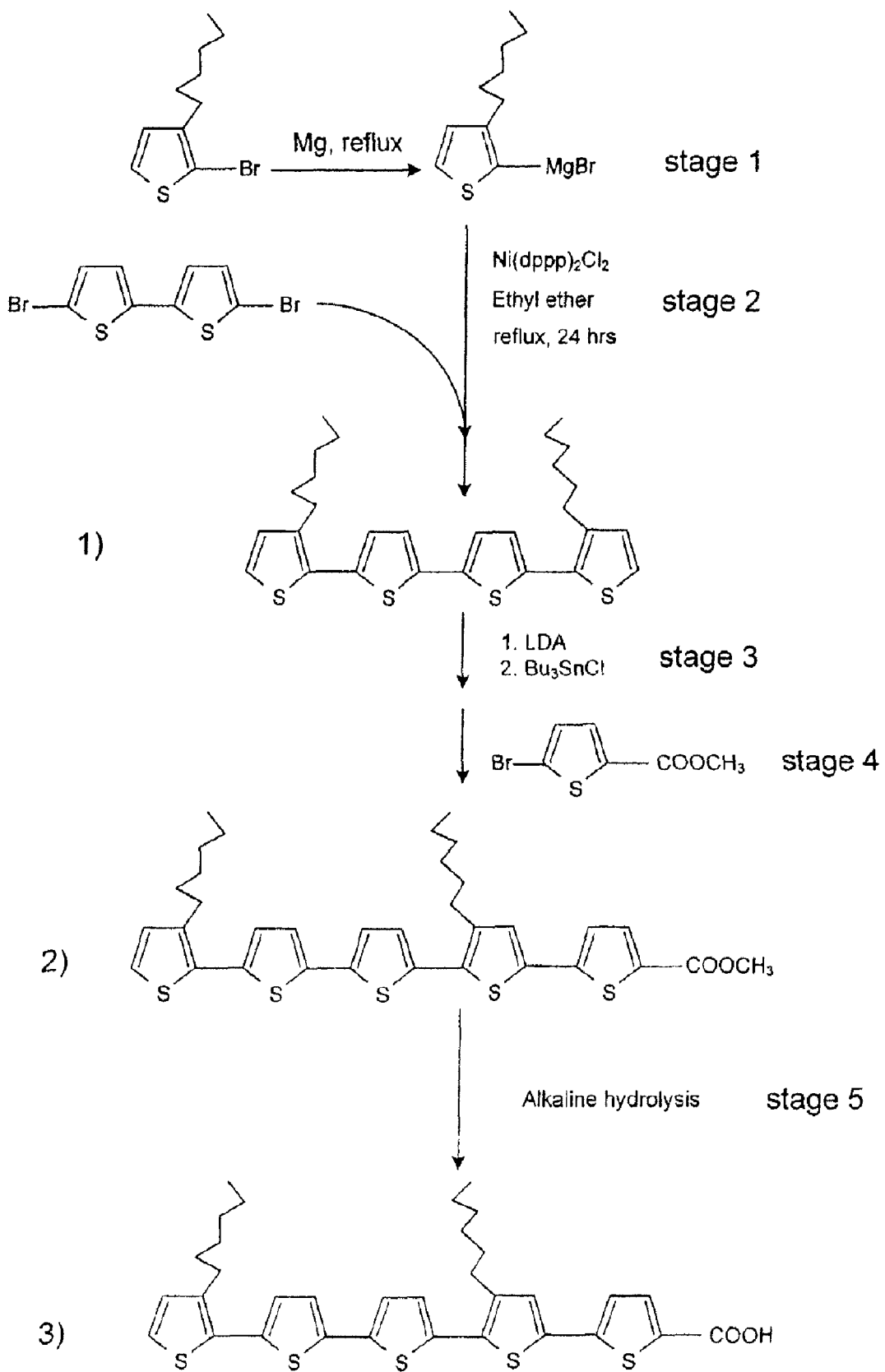
FIG. 7 illustrates an embodiment of a method for preparing a binding group.

While binder group 126 includes a phosphonic acid group, other binder groups can be prepared. Examples of other binder groups include phosphine oxide groups, amino groups, carboxy groups, and thiol groups. Referring to FIG. 7, preparation of a particle surface group having a carboxy binder group can include preparation of a Grignard reagent (e.g., 2-thiophene magnesium bromide) (as indicated by step 1), synthesis of 3,3'''-dihexyl-[2,2';5',2'';5'',2''']quaterthiophene (as indicated by step 2), stannylation of 3,3'''-dihexyl-[2,2';5',2'';5'',2''']quaterthiophene (as indicated by step 3), coupling of the stannylated 3,3'''-dihexyl-[2,2';5',2'';5'', 2''']quaterthiophene with 5-bromo-2-thiophene carboxylate (as indicated by step 4), and hydrolysis of the monoester to the corresponding carboxylic acid (as indicated by step 5). The order of at least some of these steps can be changed, steps can also be combined, and some steps can be eliminated (e.g., preparation of the Grignard reagent).

A Grignard reagent can be prepared as desired. Typically, an amount of magnesium (e.g., magnesium turnings) are combined with a solvent (e.g., ethyl ether) in a reaction flask. In an exemplary embodiment, about 1.07 g magnesium (e.g., about 0.44 mmoles) is combined with about 15 mL ethyl ether. While the magnesium is stirred slowly under $N_2$, dropwise addition of a solution of 2-bromo-3-hexyl-thiophene, 9 g. (36.4 mmoles) in 50 mL ethyl ether is performed. After addition of the bromide, the system is refluxed for 2 hours. The 2-thiophene magnesium bromide Grignard thus formed is used below.

The Grignard reagent prepared above, added dropwise to a suspension of 5.0 g (15.4 mmoles) of 5,5'-dibromo-2,2'-bithiophene and 0.084 g (0.154 mmoles) of $Ni(dppp)_2Cl_2$ in 50 mL dry ethyl ether. Typically, the Grignard is added from a feeding funnel under an inert gas (e.g., $N_2$). The resulting mixture was heated to reflux for about 20 hours. The resulting mixture is cooled to about room temperature (e.g., to about 20° C.) and combined with about 200 mL of 5% aqueous $NH_4Cl$ to which some ice is added, to effect hydrolysis. The aqueous phase is extracted with about 2×100 mL of $CH_2Cl_2$. The organic phases combined are back washed with about 200 mL water and dried over $MgSO_4$. The solvent is evaporated to give a raw product, 3,3'''-dihexyl-[2,2';5',2'';5'',2'''] quaterthiophene, which can be purified using, for example, a silica-gel column using hexanes 100% as eluant to give 6.4 g of material, (yield=83.4%). Proton NMR can be used to determine the presence of the raw product: $^1HNMR$: 7.25 ppm, (2H, d), 7.20 ppm, (2H, d), 7.10 ppm, (2H, d), 7.00 ppm, (2H, d), 2.83 ppm, (4H, t), 2.7 ppm, (4H, m), 1.41 ppm, (12H, m), 1.00 ppm, (6H, m).

The 3,3'''-dihexyl-[2,2';5',2'';5'',2''']quaterthiophene can be stannylated as desired. Typically, an amount of 3,3'''-Dihexyl-[2,2';5',2'';5'',2''']quaterthiophene (e.g., 2.990 g, (6 mmoles) is dissolved in 50 mL of dry THF and cooled to about 0° C. About 3.0 mL of lithium diisopropyl amide, (LDA) 2.0M in heptane/tetrahydrofuran/ethylbenzene are added dropwise (e.g., using a syringe). After this addition, the system is stirred for an additional hour and then 1.6 mL of $Bu_3SnCl$ (6.0 mmoles) is added. This mixture is stirred for about 45 minutes at about 0° C. and then for about 1 hour at about room temperature (e.g., at about 20° C.). Solvent from the resulting mixture is evaporated (e.g., using a Rotovap. About 100 mL of water and about 100 mL of $CH_2Cl_2$ are added to the mixture from which the solvent was evaporated. The resulting mixture is combined well (e.g., by shaking in a separatory funnel). Typically, the organic phase separates and the aqueous phase is washed with about 100 mL $CH_2Cl_2$. The organic phases are combined and dried over $Na_2SO_4$. The solvent was removed to give a stannylated product that was used without further purification.

The stannylated 3,3'''-dihexyl-[2,2';5',2'';5'',2''']quaterthiophene can be coupled with 5-bromo-2-thiophene carboxylate as desired. Typically, 5-Bromo-2-thiophene carboxylate, 1.4 g, (6.33 mmoles) and 5.156 g (6.5 mmoles) of the stannylated 3,3'''-dihexyl-[2,2';5',2'';5'',2''']quaterthiophene are combined and purged with an inert gas (e.g., $N_2$). Cessium fluoride (CsF) about 3.1 g, (20 mmoles) is added followed by about 40 mL of dry N-methylpyrrolidinone (NMP). The mixture is purged with additional $N_2$ and $Pd_2dba_3$ (about 0.406 g, 0.44 mmoles) and $P(t-Bu)_3$ (about 3.0 mL of 10% hexanes solution) is added. The mixture is stirred at room temperature (e.g., about 20°) for a period of time (e.g., for about 18 hours).

About 200 mL is added to the stirred mixture. The resulting mixture is extracted with 2× about 150 mL $CH_2Cl_2$. The organic phases are combined and dried over $MgSO_4$. The solvents are removed (e.g., using a Rotovap). The residue remaining after solvent removal can be chromatographed (e.g., on silica-gel using hexanes/$CH_2Cl_2$ mixture with varied composition from 100/0 to 70/30 v/v %). Typically, the product is eluted with hexanes/$CH_2Cl_2$ 80/20 as a third fraction. The coupled product can be recrystallized (e.g., from hexanes) to remove NMP. Typically, about 0.546 g. of mono and the doubly coupled materials are obtained. The mono and the doubly coupled materials can be separated using, for example, a silica-gel column with hexanes/ethyl acetate 80/20 v/v % as eluant, to obtain about 0.252 g of the monoester and about 0.108 g of the diester. The methyl ester group appears about 3.95 using $^1H$ NMR spectroscopy.

The monoester prepared above can be hydrolyzed to the corresponding carboxylic acid as desired. In some embodiments, about 0.252 g, (0.39 mmoles) is dispersed in about 15 mL of a 0.4M NaOH ethanolic solution and heated to about 60° C. for a period of time (e.g., about 4 hours). The resulting mixture is combined with (e.g., poured into) about 100 mL 0.2 M aqueous HCl. A precipitate is collected by filtration and dried for a period of time (e.g., about 5 hours) at about 60° C. under reduced pressure. About 0.172 g of a pentatiophene carboxylic acid is typically obtained.

Proton NMR typically indicates that the methyl ester peak at 3.95 ppm is reduced or eliminated. FT-IR spectroscopy typically indicates the presence of a carboxylic group at about 1710 $cm^{-1}$. $^{13}C$ NMR typically indicates the presence of a carboxylic acid group (e.g., by a peak at about 165 ppm). Ultraviolet visible spectroscopy typically indicates a peak at about 422 nanometers with an extinction coefficient of about 33644 L cm per mol in $CHCl_3$.

Without wishing to be bound by theory, it is believed that a carboxy binder group allows more efficient electron transfer to particles 119 than phosphonic acid binder group 126.

In general, particle surface group 121 can be associated with particles 119 as desired.

Typically, the method includes forming a mixture of the particle surface groups 121, particles 119, and a solvent (e.g., an organic solvent such as $CH_2Cl_2$). Particles 119 may be fixed (e.g., with respect to surface 131 of layer 103) or free. In some embodiments, the surfaces of the particles include a coating that remains from their synthesis. The mixture is allowed to react for a period of time sufficient to displace the coating (if present) and associate the particle surface groups with the particles. In general, the time is from about 3 hours to about 24 hours (e.g., from about 10 hours to about 16 hours, such as about 12 hours). Generally, the temperature is from about 10° C. to about 80° C. (e.g., from about 15° C. to about 50° C., such as about 30° C.). The reaction can be carried out in an inert environment (e.g. beneath a water-free atmosphere, such as dry nitrogen and/or argon). After allowing the mixture to react, a second organic solvent (e.g., methanol or ethyl acetate) is added to the mixture to precipitate particles 119 with associated particle surface groups 121. Displaced coating and excess particle surface groups are removed from the precipitated particles by washing with the second solvent.

Particles 119 with particle surface 121 can be combined with photoactive binder 117 and LC material 200 to form photoactive layer 113.

Photoactive binder material 117 is typically a conductive polymer able to transport electrons. Examples of photoactive binder materials include polythiophene, polythiophene derivatives (e.g., poly-(3-hexylthiophene)), and other polymers discussed above with respect to the particle surface group and below with respect to the LC material.

Figure 4:
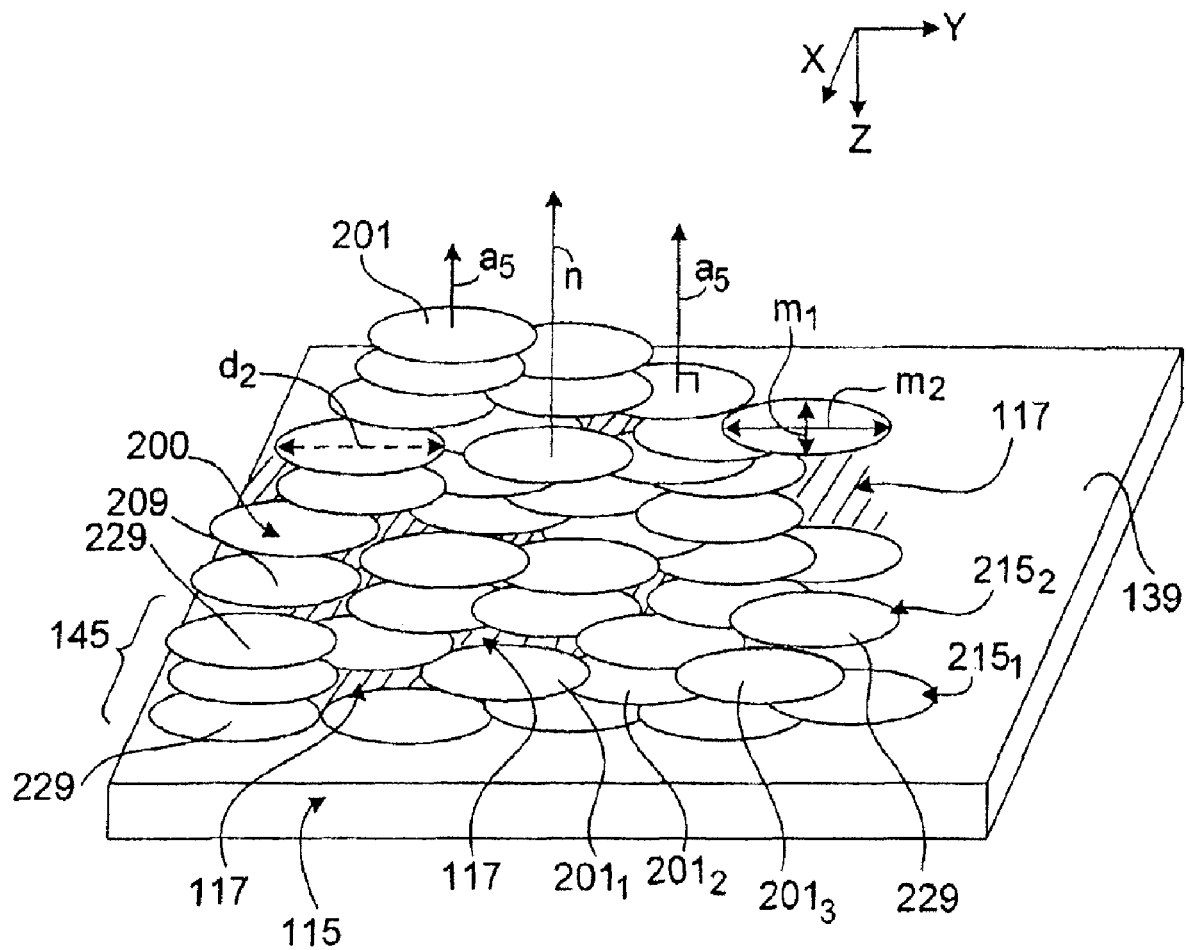
FIG. 4 is a schematic illustration of liquid crystal material of the photovoltaic cell of FIG. 1.

Turning now to LC material 200, FIG. 4 shows that the LC material is a discotic nematic LC material. The term discotic, as used herein, refers to an LC material in which the LC units are substantially flat and/or disc-like. The term nematic, as used herein, refers to an LC material in which the LC units have at least some orientational order but have at least somewhat random positional order (i.e., their positions are at least somewhat uncorrelated). We first discuss the orientational order of LC units 200. As seen in FIG. 4, LC units 201 orient so that their symmetry axes $a_s$ are generally aligned with one another (i.e., axes $a_s$ are generally aligned normal to an inner surface 139 of hole injection layer 115). The aligned symmetry axes $a_s$ define the direction of a layer director n of the LC material.

In some embodiments, the maximum average maximum radial dimension $d_2$ of LC units 200 is at least about 15 Angstroms (e.g., at least about 20 Angstroms, at least about 30 Angstroms, at least about 35 Angstroms). In certain embodiments, the maximum average diameter $d_2$ is at most about 40 Angstroms (e.g., at most about 35 Angstroms, at most about 30 Angstroms). In some embodiments, the maximum average diameter is about 18 Angstroms.

Turning to positional order, the positions of LC units that are relatively closely spaced along the z-axis can exhibit at least some correlation. For example, the LC material may include at least some domains in which LC units align to define columns extending along, for example, the z-axis (e.g., a column 145). In general, the centers of mass 229 of the aligned LC units in a column have a maximum offset of no more than about 70% (e.g., no more than about 50%, no more than about 30%, no more than about 20%, no more than about 15%, no more than about 10%) of the maximum radial dimension $d_2$ of the LC units. Hence, the extent of positional ordering can determine the height of the columns. In certain embodiments, the average height of the columns along the z-axis is no more than about 2500 Angstroms (e.g., no more than about 1250 Angstroms, no more than about 625 Angstroms, no more than about 300 Angstroms, no more than about 200 Angstroms, no more than about 100 Angstroms, no more than about 50 Angstroms, no more than about 25 Angstroms, no more than about 10 Angstroms).

In some embodiments, the LC material includes domains of LC units that define columns only within a certain maximum distance from surface 131 of layer 103 or surface 139 of layer 115. For example, domains of LC units defining columns may be present within 1000 Angstroms (e.g., within 500 Angstroms, within 250 Angstroms, within 125 Angstroms) of surface 131 and/or surface 139 but not within LC material located at greater distances from surface 131 and/or surface 139.

In some embodiments, the positions of the LC units are substantially random (e.g., substantially uncorrelated). For example, in certain embodiments, essentially no columns are formed within LC material (i.e., the positions of the centers of masses of LC units in adjacent layers of the LC material are, on average, substantially random).

Figure 5A:
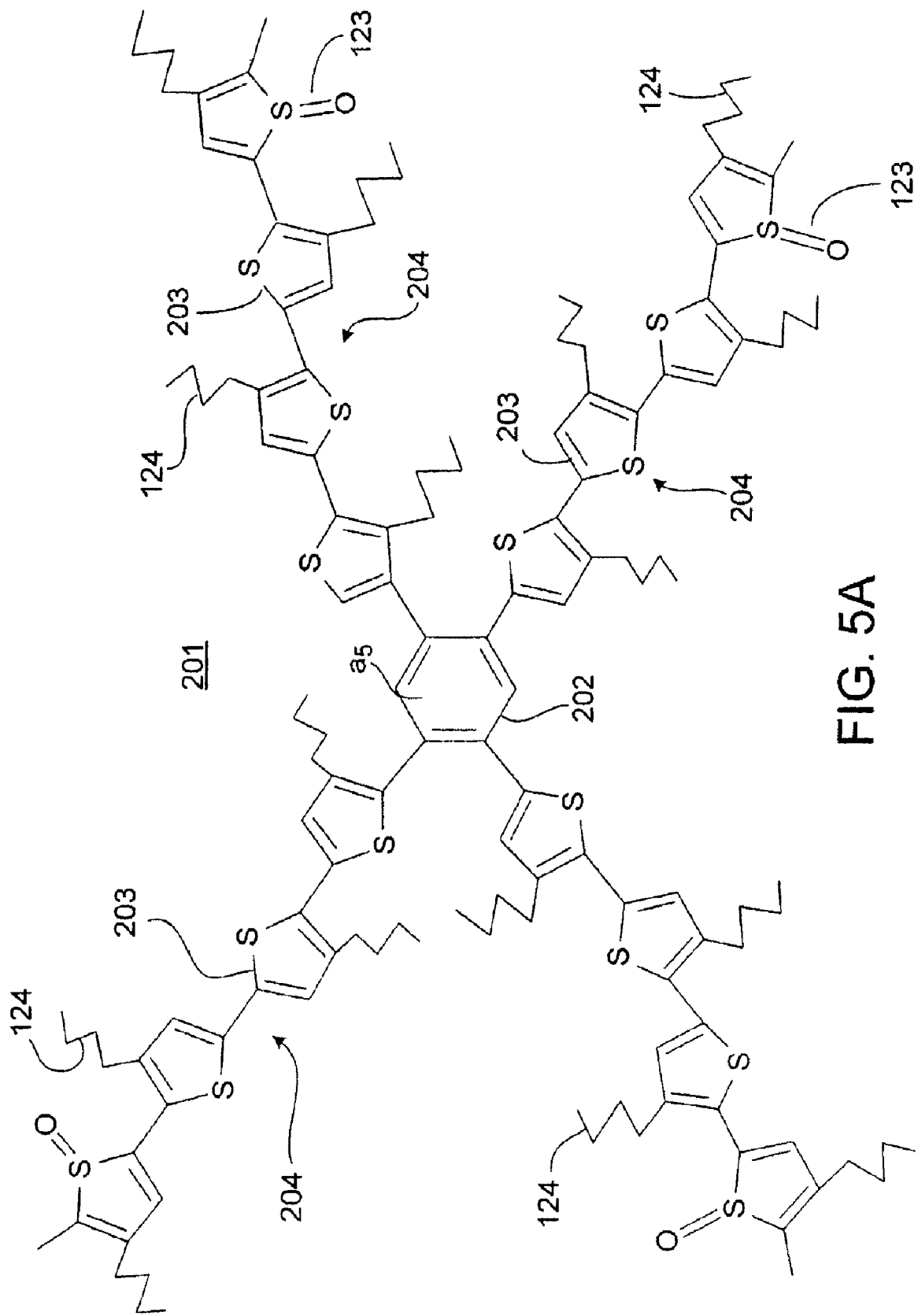
FIGS. 5A-5E illustrate embodiments of units of liquid crystal materials.

Referring to FIG. 5A, LC units 201 include a plurality of arms 204 extending from a central group 202. In general, LC units have at least 2 arms (e.g., 3 arms, 4 arms, 5 arms, 6 arms, 7 arms, 8 arms, or more). At least some of the arms 204 include a conducting polymer 203, which, in LC unit 201 of FIG. 5A, is a polythiophene polymer having 4 units (e.g., thiophene rings, vinyl groups, phenyl groups). Each arm includes a plurality of solubilizing groups 204. Examples of solubilizing groups that can be used for LC units include solubilizing groups discussed above with respect to particle surface groups 121.

Conducting polymer 203 of arms 204 and/or central group 202 are able to absorb light (e.g., solar radiation) that enters photoactive layer 113. As discussed above, the light absorption can produce excitons within photoactive layer 113. LC units 201, e.g., central group 202 and arms 204 thereof, can typically transfer excitons across at least a portion (e.g., all) of the LC unit. Exciton transfer between LC units is discussed below.

At least some (e.g., all) of arms 204 can include one or more light absorption modifiers (e.g., one or more sulfoxide groups) to enhance absorption of visible solar radiation as discussed above with respect to particle surface groups 121. For example, at least some (e.g., all) of the terminal units of arms 205 may include a light absorption modifier.

Figure 5B:
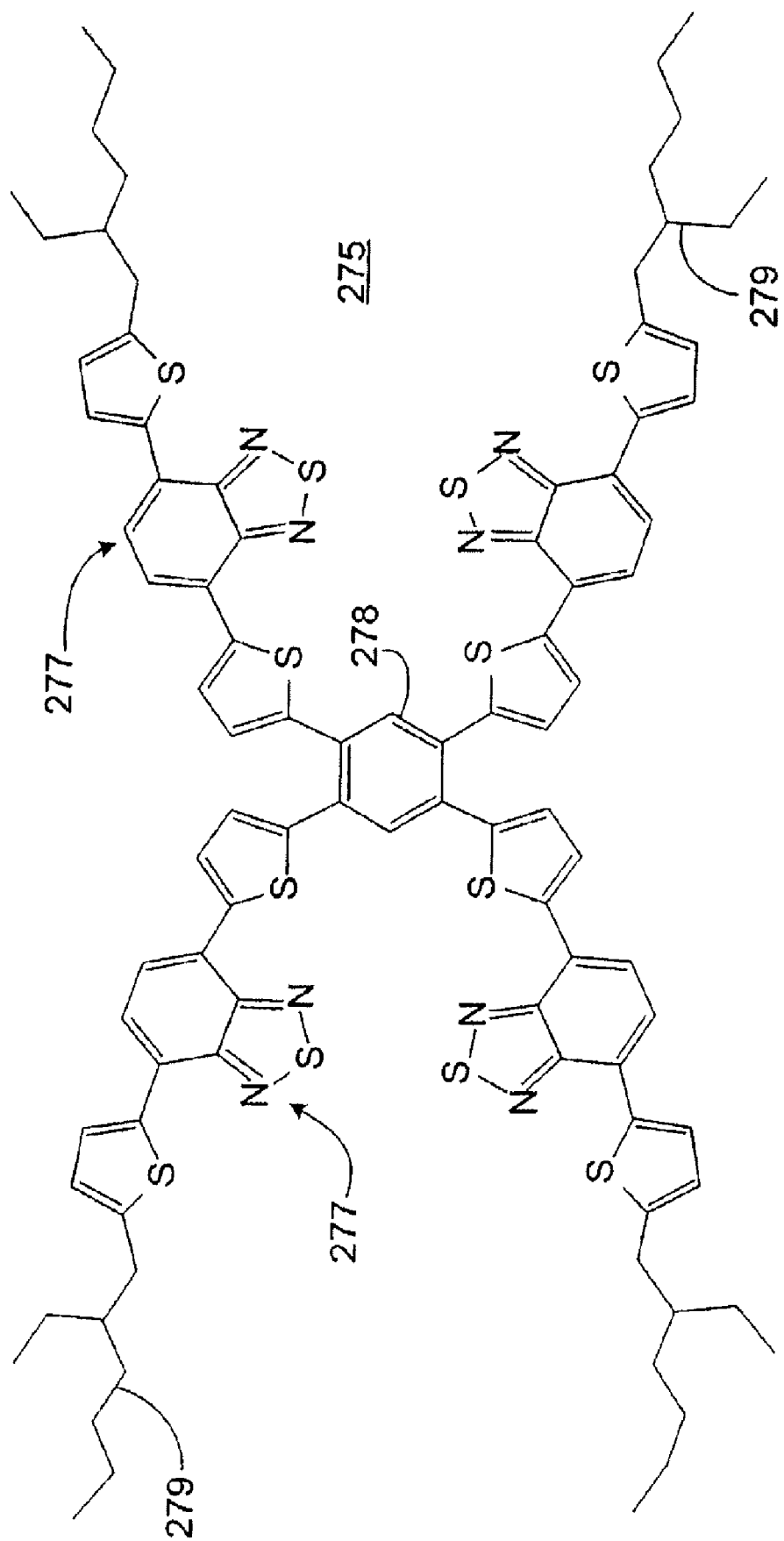
Figure 5C:
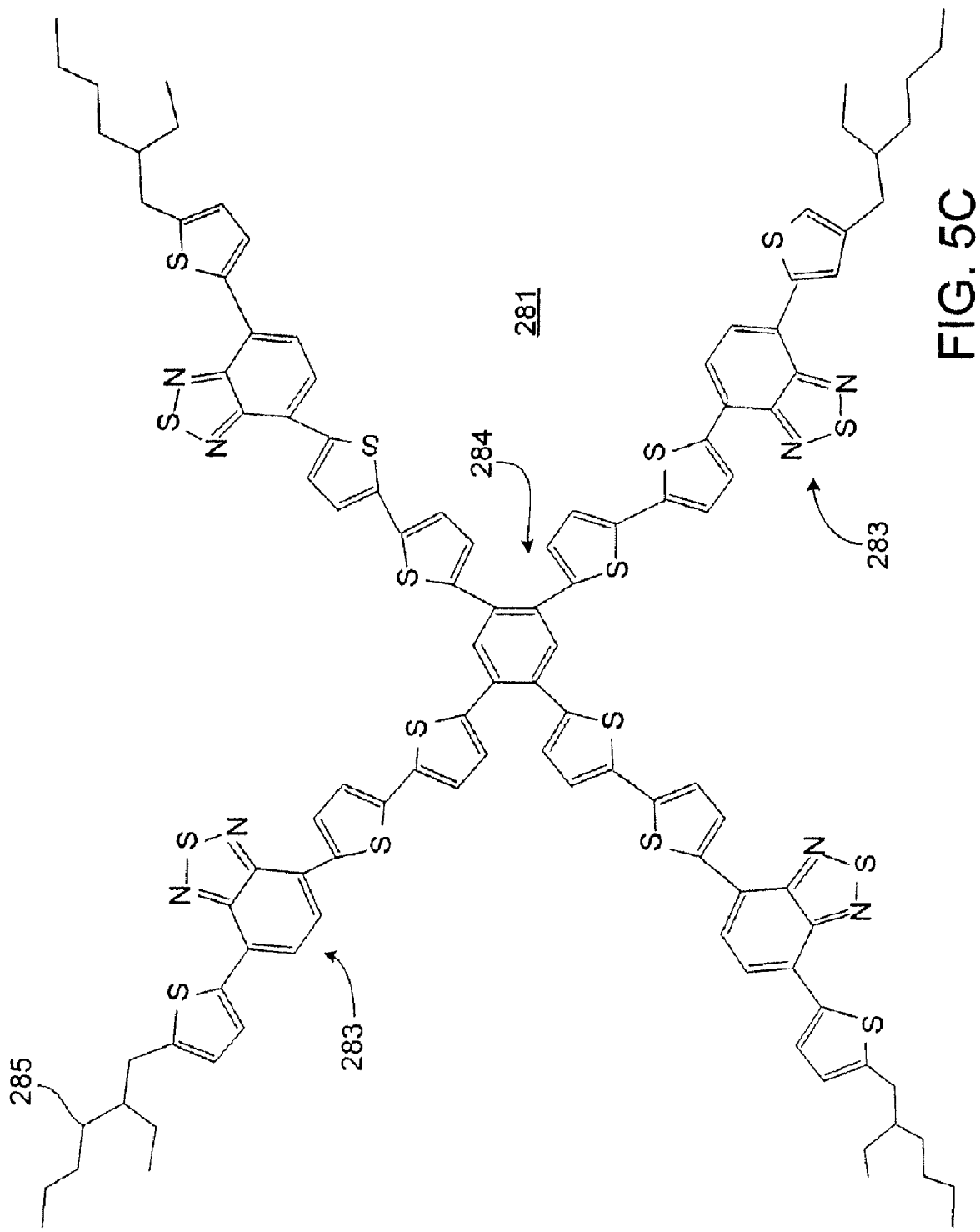
Figure 5D:
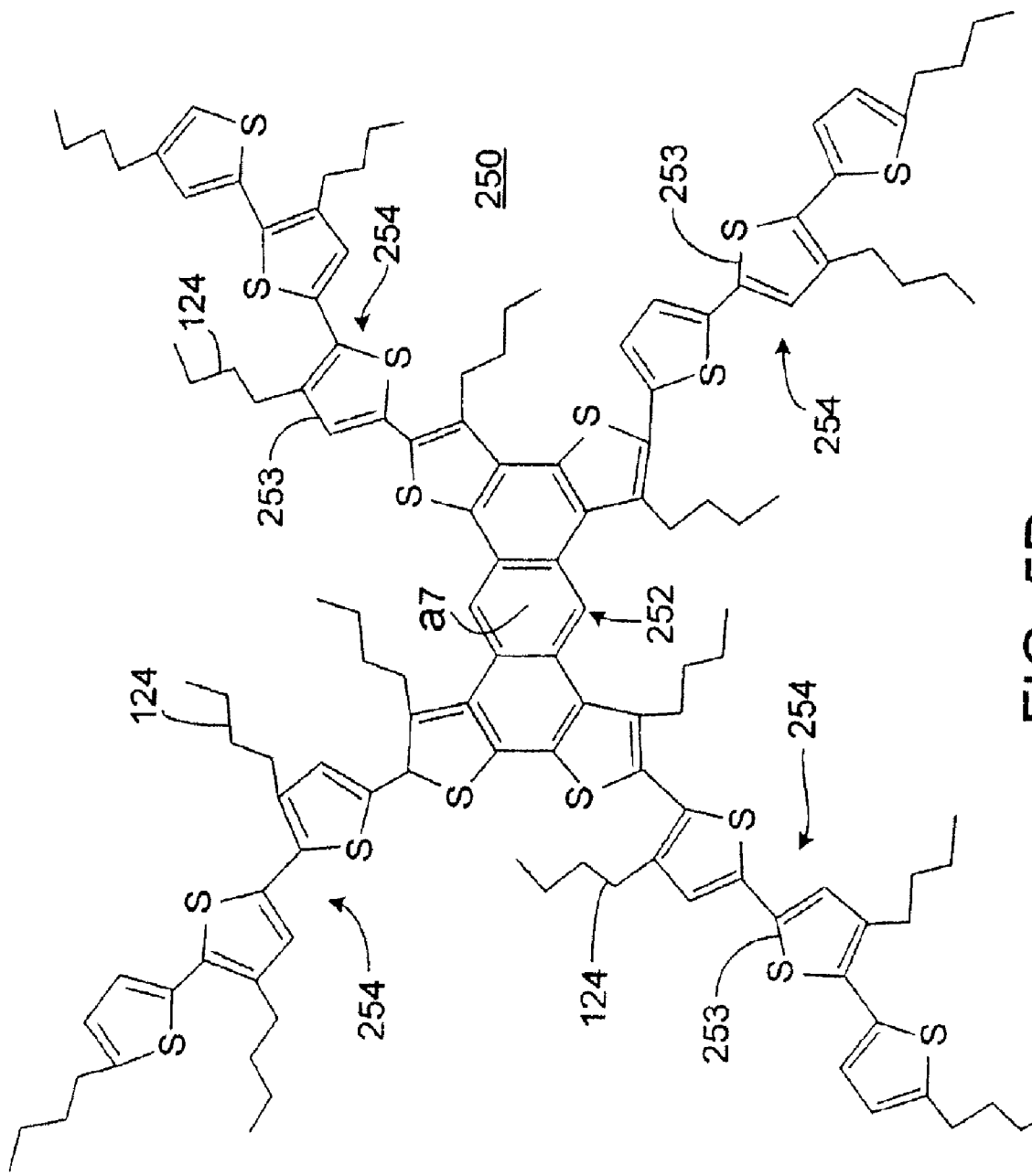
Figure 5E:
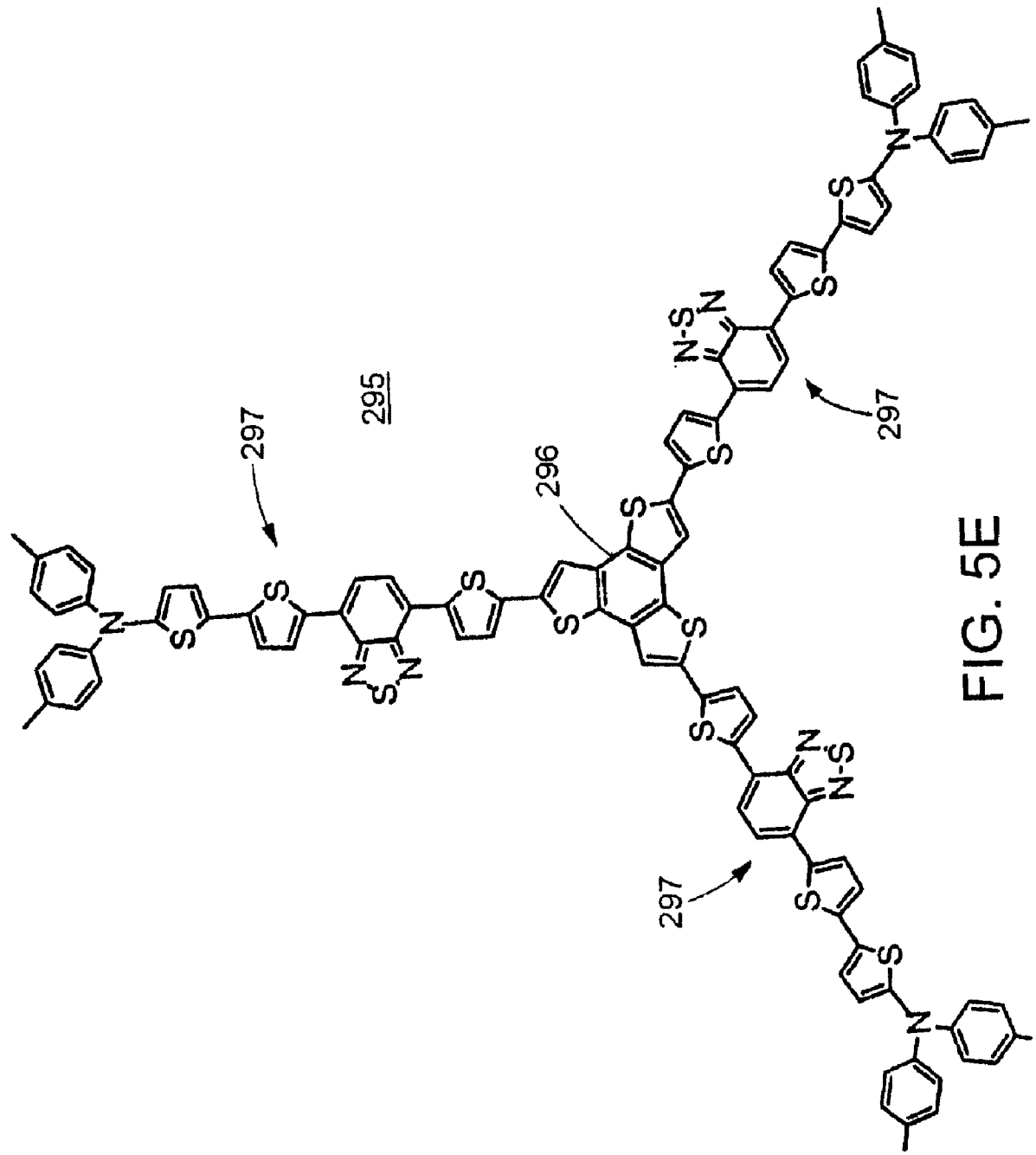

While LC unit 201 has been described as having a central group 202 formed of a benzene ring and arms 204 each formed of a 4-unit conducting polymer 203, other LC units can be used. For example, referring to FIG. 5B, an LC unit 275 includes 4 arms 277 and a central group 278. Each arm 277 includes three units: two 5-member rings and 1 unit defined by fused 5- and 6-member rings. Central group 278 is a benzene ring. Arms 277 include a solubilizing group 279. As another example, referring to FIG. 5C, an LC unit 281 includes 4 arms 283 and a central group 284. Each arm includes three 5-member rings and unit defined by fused 5- and 6-member rings. Arms 283 include a solubilizing group 285. Central group 284 is a benzene ring. Referring to FIG. 5D, an LC unit 250 includes a central group 252 and a plurality of arms 254. Each arm includes a conducting polymer 253 defined by three thiophene units. Arms 254 include a plurality of solubilizing groups 124. Central group 252 is a fused aromatic ring system. Referring to FIG. 5E, an LC unit 295 includes a central group 296 and a plurality of arms 297. Each arm 297 is defined by 5 units. Three units of each arm 297 are thiophene rings, one unit includes fused 5- and 6-member rings, and one unit includes a pair of pendent benzene rings.

In general, arms of LC units may have a number of units, such as 3 units (e.g., 4 units, 5 units, 6 units, 7 units, 8 units, 9 units, 10 units, or more). In addition to the arms shown in FIGS. 5A-5E, arms of LC units may be formed of other materials such as any of the units and/or conducting polymers discussed above with respect to conducting polymer 122 of particle surface groups 121.

In general, the central group of an LC unit includes one or more aromatic ring systems. Examples of aromatic ring systems include a phenyl group, a napthyl group, a anthracyl group, a pyrenyl group, a terphenyl group, a corenene group, or a combination thereof. A central group can include one or more heteroatoms (e.g., sulfur, oxygen, or nitrogen). For example, a central group can include one or more heterocyclic ring systems (e.g., 2 heterocyclic rings, 3 heterocyclic rings, 4 heterocyclic rings, 5 heterocyclic rings, 6 heterocyclic rings, or more). In some embodiments, at least some (e.g., all) of the heterocyclic ring systems include sulfur. In some embodiments, the central group is free of metal atoms and/or chelated atoms.

In some embodiments, the central group of an LC unit includes smallest ring systems of at least two different sizes. For example, in FIG. 5D, central group 252 of LC unit 250 includes a ring system defined by an anthryl group and 4 fused ring systems each defined by a thiophene ring. Hence, central group 252 has 3 smallest rings of 6 members each (e.g., the rings of the anthryl group) and 4 smallest rings of 5 members each (e.g., the fused thiophene rings). The fused thiophene rings can broaden the range of light absorbed by central group 252. As another example, in FIG. 5E, central group 291 of LC unit 287 includes a benzene ring fused with three thiophene rings.

Figure 6A:
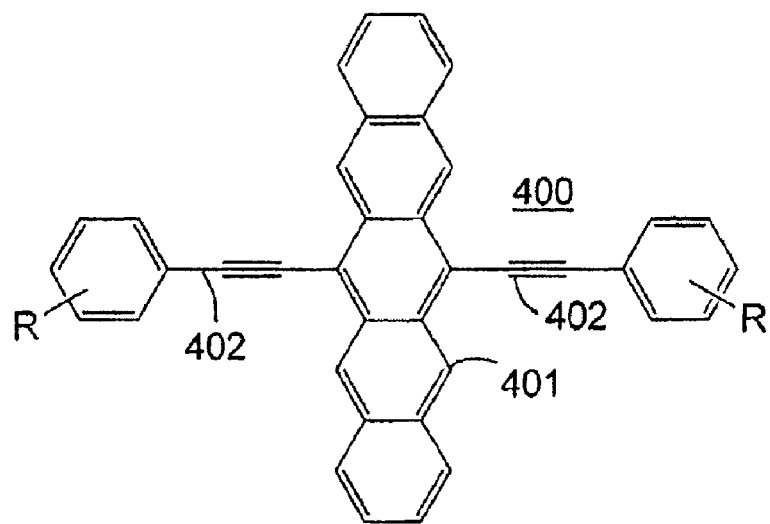
FIGS. 6A-6F illustrate embodiments of central groups of units of liquid crystal materials.
Figure 6B:
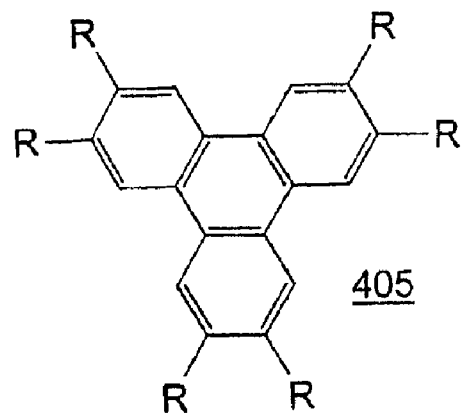
Figure 6C:
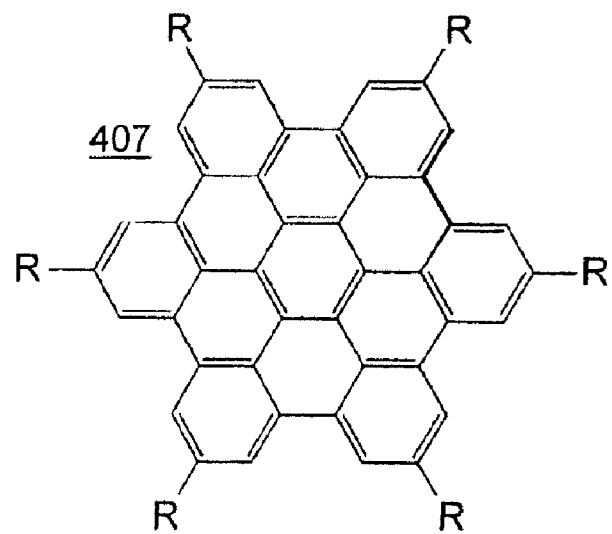
Figure 6D:
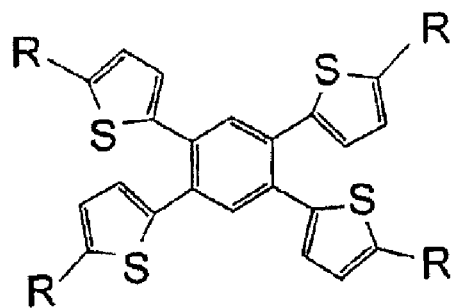
Figure 6E:
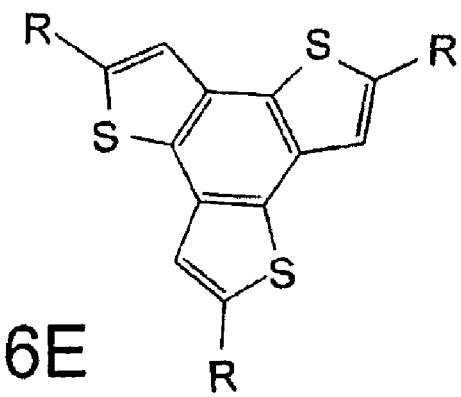
Figure 6F:
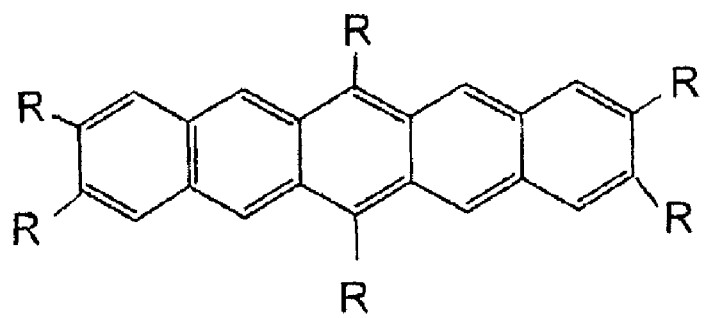

Referring to FIGS. 6A-6F, other examples of central groups are shown. In FIG. 6A, a central group 400 includes a linear chain 401 of fused benzene rings and a pair of side groups 402 each having a benzene ring. A substituent group R may be any arm discussed above or another group such as hydrogen, aliphatic, aromatic, or a functional group. The substituents of a central group may be all the same or at least some may be different from others. In FIG. 6B, a central group 405 is defined by a triphenylene ring system. In FIG. 6C, a central group 407 is defined by a polyaromatic ring system having 13 benzene rings. In FIG. 6D, a central group 409 is defined by a benzene ring with 4 pendent thiophene rings. In FIG. 6E, a central group 411 is defined by a benzene ring fused with three thiophene rings. In FIG. 6F, a central group is defined by a linear chain of 5 fused benzene rings.

Orientational and/or positional order of the LC units can enhance electron and/or hole transfer through photoactive layer 113. Without wishing to be bound by theory, it is believed that electron and/or hole transfer between adjacent LC units within a layer (e.g., between LC units $201_1$ and $201_2$ of layer $215_2$ as seen in FIG. 4) is enhanced by the interdigitation of arms 204 of the adjacent LC units (FIG. 5). It is also believed that electron and/or hole transfer between LC units within different layers (e.g., between LC unit $201_2$ of layer $215_2$ and LC unit $201_3$ of LC unit $215_1$) is enhanced by at least some interfacial overlap between central groups 202 of the LC units.

Photoactive binder 117, which is present within LC material 200, also facilitates transfer of excitons and holes through photoactive layer 113. For example, photoactive binder 117 can enhance transfer between LC units of different layers that lack substantial interfacial overlap of their central groups. The energies of the HOMO's and lowest occupied molecular orbitals (LUMO's) of arms of the LC units and of the photoactive binder material 117 are typically similar to further facilitate electron and hole transport.

The orientational order of the LC units can also enhance the performance of cell 100 by increasing the amount of light absorbed by the LC material. Because the symmetry axes $a_5$ of the LC units tend to orient along the z-axis of cell 100, the optical transition moments $m_1$ of the LC units lie generally in the x-y plane of inner surface 139 of hole injection layer 115 (the transition moments $m_1$ are perpendicular to the symmetry axes $a_5$). This orientational order can increase the amount of light absorption by the LC units by at least 2 times (e.g., at least 3 times) as compared to unordered LC units.

As discussed above, LC units 201 can have at least some order (e.g., orientational order) with respect to inner surface 139 of hole injection layer 115. Hence, we discuss the hole injection layer before discussing preparation of LC material 200.

Hole injection layer 115 is generally formed of a material that, at the thickness used in photovoltaic cell 100, transports holes to electrode 111 (FIG. 1). In some embodiments, hole injection layer 115 is a PEDOT polymer polymerized from an ethyldioxythiophene (EDOT) monomer. Other examples of materials from which layer 115 can be formed include polyanilines, polyvinylcarbazoles, polyphenylenes, polyphenylvinylenes, polysilanes, polythienylenevinylenes and/or polyisothianaphthanenes. In some embodiments, hole injection layer 115 can include combinations of materials.

Hole injection layer 115 can be prepared as desired such as by coating (e.g., by spin coating, slot-coating, or roll-to-roll coating). In general, layer 115 is at least about 25 nanometers thick (e.g., at least about 50 nanometers, at least about 75 nanometers, at least about 100 nanometers, at least about 150 nanometers thick). In some embodiments, layer 115 is no more than about 200 nanometers thick (e.g., no more than about 150 nanometers, no more than about 125 nanometers, no more than about 100 nanometers thick).

LC material 200 can be prepared as desired. Typically, a mixture including LC units and, optionally, photoactive binder 117 and/or a solvent (e.g., $CHCl_3$, THF, chlorobenzene, or combination thereof) is applied to inner surface 139 of hole injection layer 115. The mixture can be applied, for example, as a coating. The solvent is allowed to evaporate at a temperature of, for example, from about 10° C. to about 80° C. (e.g., from about 15° C. to about 50° C., such as about 30° C.). As the solvent evaporates, intermolecular interactions between different LC units (e.g., interactions between central groups 202) typically promote self-assembly of the LC material on inner surface 139 (FIG. 4). Once a sufficient amount of the solvent evaporates, the orientations and positions of the LC units are stable with respect to further processing.

The degree of orientational and/or positional order within the LC material can be modified by, for example, changing the nature of the LC units, the temperature, solvent, and/or rate of solvent evaporation. For example, positional order can be increased by using LC units with larger diameter central groups. The larger central groups increase interfacial attraction between the LC units in adjacent layers (e.g., an LC material formed of LC unit 250 with central group 252 (FIG. 6) can have more positional order than LC material 200 formed of LC unit 201 with central group 202 (FIG. 5)). In some embodiments, positional order is increased by use of large, rigid arms, which can provide positional order even to LC units having a small central group such as a benzene ring. As another example, positional order can be decreased by evaporating the solvent more rapidly because the LC units have less time to move into different positions (e.g., more aligned positions) before the solvent evaporates.

Photovoltaic layer 113 can be prepared by contacting the assembled LC material and optional photoactive binder 117 present on the inner surface 139 of hole injection layer 115 with particles 119 of counterelectrode 103. The oriented particles extend into the assembled LC material and photoactive binder. Typically, the contacted components are thermally laminated so that the LC material, photoactive binder 117, and particles are sandwiched between the hole injection layer 115 and counterelectrode 103.

Photoactive layer 113 can have a thickness as desired. In general, the thickness of photoactive layer 113 may slightly exceed a maximum distance of particles 119 from surface 131 of layer 103. In some embodiments, photoactive layer 113 is at least about 50 nanometers thick (e.g., at least about 100 nanometers, at least about 150 nanometers, at least about 225 nanometers, at least about 300 nanometers thick). In some embodiments, photoactive layer 113 is no more than about 1000 nanometers thick (e.g., no more than about 400 nanometers, no more than about 350 nanometers, no more than about 250 nanometers thick).

The lateral dimensions (e.g., the length and width) of cell 100 can prepared as desired. In some embodiments, cell 100 is at least about 2 mm wide (e.g., at least about 3 mm, at least about 5 mm, at least about 7.5 mm, at least about 10 mm wide). In some embodiments, cell 100 is no more than about 25 mm wide (e.g., no more than about 15 mm, no more than about 10 mm wide). In some embodiments, cell 100 has a strip-like shape at least about 20 mm long (e.g., at least about 30 mm, at least about 50 mm, at least about 100 mm, at least about 200 mm long, at least about 1000 mm long). In some embodiments, cell 100 is no more than about 250 mm long (e.g., no more than about 20 mm, no more than about 10 mm long).

A plurality of cells 100 can be electrically connected to form a module. For example, a module can include a plurality (e.g., at least 2, at least 3, at least 4, or more) cells connected in series and/or parallel.

In some embodiments, inner surface 139 of hole injection layer 115 is patterned to produce surface features that facilitate orientational ordering and/or self-assembly of the LC material. These features increase the tendency of the LC units to orient at the surface. For example, in certain embodiments, inner surface 139 is mechanically modified before applying the LC units and photoactive binder material to the surface. The mechanical modification produces minute, oriented features (e.g., scratches) in surface 139. Such mechanical modification can be performed, for example, by buffing the inner surface with a polishing cloth such as used for polishing optical surfaces.

In certain embodiments, a chain-like surfactant (e.g., an amphiphile) is applied to the surface of the hole injection layer. The surfactant chains tend to align normally with respect to the surface. These aligned chains act as surface features that orient the LC units.

In some embodiments, hole injection layer 115 is prepared by a polymerization method that produces a patterned, oriented inner surface. The patterned surface facilitates alignment of LC units 201. In certain embodiments, the polymerization method includes preparing a mixture of a monomer (e.g., EDOT), an electrolyte (e.g., tetraethylammonium perchlorate (TEAP), and a plurality of amphiphiles (e.g., poly (oxyethylene)$_n$-oleyl ether (where n is, for example, about 10)). The concentration of monomer is typically about 0.1 M. The concentration of electrolyte is typically about 0.1 M. Water is added to the mixture, which is then sealed and mixed. The mixture is typically heated to a temperature of from about 25° C. to about 100° C. (e.g., from about 70° C. to about 90° C., such as about 80° C.). The mixture forms a gel upon cooling.

A conductive substrate (e.g., an indium tin oxide (ITO) film on a glass substrate) is cleaned (e.g., by sonication and rinsing with an organic solvent). The gel is applied to the substrate. The amphiphiles within the gel tend to orient on the surface forming an LC template. The EDOT monomer resides within oriented interstices of the LC template. The EDOT is then electropolymerized to prepare a PEDOT layer with a patterned surface, which has a plurality of substantially perpendicular PEDOT rods. After polymerization, the LC template is washed away (e.g., by rinsing with a solvent such as water) to expose the patterned surface.

The PEDOT layer with patterned surface can be used as the hole injection layer of the photovoltaic cell. A mixture including LC units 200, photoactive binder 117, and a solvent is applied to the patterned surface. The solvent is allowed to evaporate. The oriented rods of the patterned surface facilitate alignment of the LC units with their symmetry axes $a_5$ generally perpendicular to the PEDOT layer. The exposed LC material and photoactive binder are laminated with particles 119 and counterelectrode 103 as discussed above.

In some embodiments, a layer 115 with a patterned surface is prepared by photopolymerization. For example, compounds with one or more double bonds (e.g., a cinnamate) is deposited on a PEDOT surface and irradiated with linearly polarized light. The light is only absorbed by double bonds aligned with the polarization. Adjacent double bonds polymerize to form a cyclobutane group. The polymerizing molecules bring their neighbors into alignment. This process of selective absorption and polymerization forms a patterned surface, which can orient LC units applied thereto.

In some embodiments, a mixture of LC units, photoactive binder 117, and a solvent is applied directly to particles 119 of counterelectrode 103 (e.g., the mixture can be applied to the particles before or concurrently with contacting the mixture and the hole injection layer). The LC units and photoactive binder intercalate among the oriented particles. The solvent is allowed to evaporate. The hole injection layer 115 is laminated over the exposed LC material and photoactive binder to seal the photoactive layer 113.

In some embodiments, the LC material is prepared without use of a solvent. Typically, LC units and, the optional photoactive binder are heated, e.g., to a temperature above the transition temperature of the LC units so that the LC units are able to flow. The heated LC units and optional binder are applied to surface 131 of layer 103 and/or to surface 139 of layer 115. In general, the amount of LC units applied to surface 131 is sufficient to cover particles 119. Layers 103 and 115 are mated to sandwich the LC material therebetween. Upon cooling, the LC material assumes the desired degree of positional and/or orientational order. The LC material can be heated before and/or after application to surface 131 and or surface 139.

Turning now to other components of cell 100, conductive layer 111 is generally formed from a layer of a material having an electrical conductivity of at least about 10 $(\Omega\text{-cm})^{-1}$ at 25° C., and can have a composition and thickness that can be selected based on electrical conductivity, optical properties, and/or mechanical properties as desired. In some embodiments, the layer 111 can be transparent. Examples of transparent conductors include certain metal oxides, such as indium tin oxide (ITO), tin oxide, a fluorine-doped tin oxide, and zinc-oxide. In certain embodiments, layer 111 can be non-transparent (e.g., substantially opaque). Examples of opaque conductors include a continuous layer (e.g., a foil) of a metal. In some embodiments, the metal can be, for example, copper, aluminum, titanium, indium, or gold.

In certain embodiments, layer 111 includes a discontinuous layer of a conductive material. For example, layer 111 can include an electrically conducting mesh. Suitable mesh materials include metals, such as palladium, titanium, platinum, stainless steel, copper, gold, and alloys including such metals. The mesh material can include a metal wire. The electrically conductive mesh material can also include an electrically insulating material that has been coated with an electrically conductive material, such as metal. The electrically insulating material can include a fiber, such as a textile fiber or an optical fiber. Examples of textile fibers include synthetic polymer fibers (e.g., nylons) and natural fibers (e.g., flax, cotton, wool, and silk). The mesh electrode can be flexible to facilitate, for example, formation of a photovoltaic cell by a continuous manufacturing process.

A mesh electrode, can take a wide variety of forms with respect to, for example, wire (or fiber) diameters and mesh densities (i.e., the number of wire (or fiber) per unit area of the mesh). The mesh can be, for example, regular or irregular, with any number of opening shapes (e.g., square, circle, semicircle, triangular, diamond, ellipse, trapezoid, and/or irregular shapes). Mesh form factors (such as, e.g., wire diameter and mesh density) can be chosen, for example, based on the conductivity of the wire (or fibers) of the mesh, the desired optical transmissivity, based on the conductivity of the wires (or fibers) of the mesh, the desired optical transmissivity, flexibility, and/or mechanical strength. Typically, the mesh electrode includes a wire (or fiber) mesh with an average wire (or fiber) diameter in the range from about 1 micron to about 400 microns, and an average open area between wires (or fibers) in the range from about 60% to about 95%.

A mesh electrode can be formed using a variety of techniques, such as, for example, ink jet printing, lithography and/or ablation (e.g., laser ablation). Mesh electrodes are discussed in U.S. patent application Ser. No. 10/395,823, filed Mar. 23, 2003 and in U.S. patent application Ser. No. 10/723,554, filed Nov. 26, 2003, the disclosures of which are hereby incorporated by reference.

Layer 107 is typically a transparent substrate that insulates conductive layer 111. Layer 107 can be formed of, for example, glass, polyethylene, or other transparent insulating materials.

Generally, layer 103 is formed of a material having an electrical conductivity of at least about 10 (Ω-cm)-1 at 25° C., and can have a composition and thickness that can be selected based on electrical conductivity, optical properties, and/or mechanical properties as desired. Layer 103 can be similar to layer 111. For example, layer 103 can be formed from the same materials (e.g., transparent conductor, opaque conductor), can have the same structure (e.g., continuous layer, mesh structure) and can have the same thickness as layer 111. However, it may be desirable for layer 103 to be different from layer 11 in one or more aspects. For example, in some configurations only one side of cell 100 (e.g., either the electrode 111 side or the counterelectrode 103 side) is exposed to a light source during use, the conductive layer of the unexposed side may be nontransparent material (e.g., opaque).

A number of embodiments of the invention have been described. Nevertheless, it will be understood that various modifications may be made without departing from the spirit and scope of the invention.

For example, while generally linear particle surface groups have been described, other configurations are possible. For example, in some embodiments, the particle surface groups are branched. Accordingly, other embodiments are within the scope of the following claims.

What is claimed is:

1. A discotic nematic liquid crystal (LC) material, comprising:
   a discotic nematic LC compound comprising:
      a central moiety comprising a moiety selected from the group consisting of

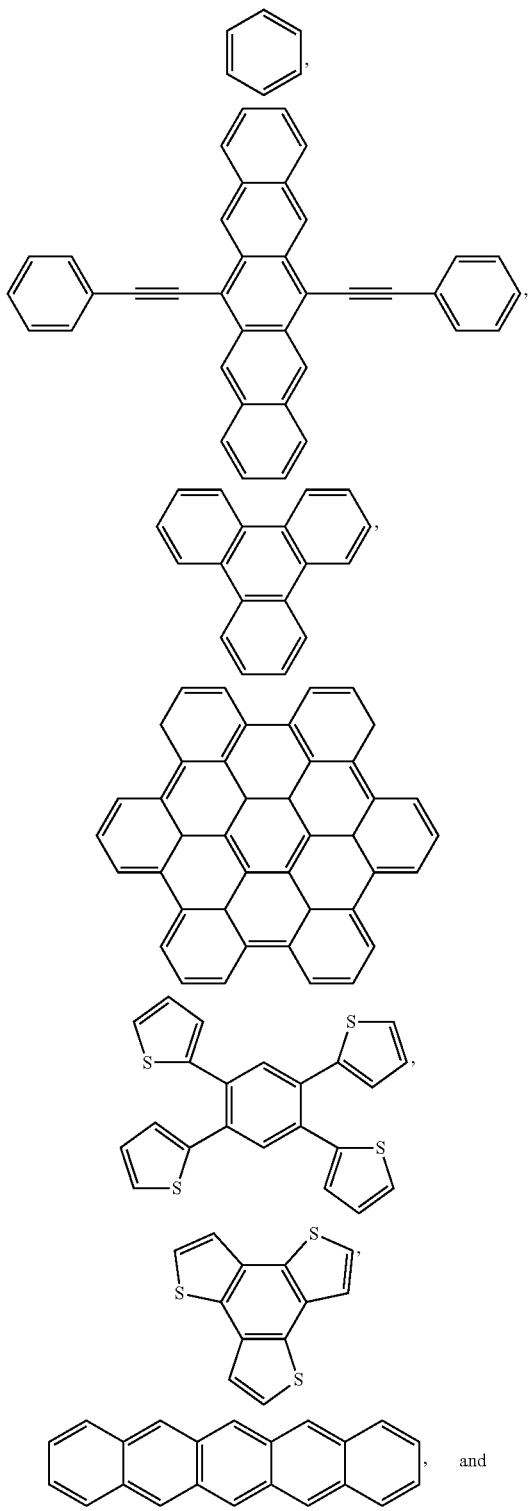

17

-continued

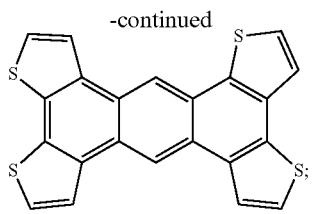

a plurality of electroactive arms extending outward from the central moiety, each arm comprising a plurality of cyclic groups, at least one of which comprising a thiophene ring.

2. The discotic nematic LC material of claim 1, wherein the central moiety comprises a plurality of fused aromatic rings.

3. The discotic nematic LC material of claim 1, wherein at least some of the cyclic groups comprise a sulphoxide group.

4. The discotic nematic LC material of claim 1, wherein the central moiety is free of metal.

5. The discotic nematic LC material of claim 1, further comprising an amount of a photoactive binder blended and in electrical communication with the discotic menatic LC compound.

6. The discotic nematic LC material of claim 5, wherein the photoactive binder comprises a polythiophene compound.

18

7. The discotic nematic LC material of claim 1, wherein the central moiety comprises at least 3 fused rings, each of the fused rings comprising 6 carbon atoms.

8. The discotic nematic LC material of claim 7, wherein the central moiety comprises at least 4 heterocyclic rings, each heterocyclic ring being fused to one of the 3 fused rings and comprising a sulfur atom.

9. A photovoltaic cell comprising the discotic nematic LC material of claim 1.

10. The photovoltaic cell of claim 9, further comprising a plurality of nanorods each having a major axis, the discotic nematic LC material defining a director, the major axis of the nanorods and the director being substantially aligned.

11. The discotic nematic LC material of claim 1, wherein each electroactive arm comprises at least two thiophene ring.

12. The discotic nematic LC material of claim 1, wherein each electroactive arm comprises at least three thiophene ring.

13. The discotic nematic LC material of claim 1, wherein each electroactive arm comprises at least one unit containing a 5-membered ring fused with a 6-membered ring.

14. The nematic LC material of claim 13, wherein the at least one unit comprises a benzothiadiazole group.

15. The discotic nematic LC material of claim 1, wherein the discotic nematic LC compound is

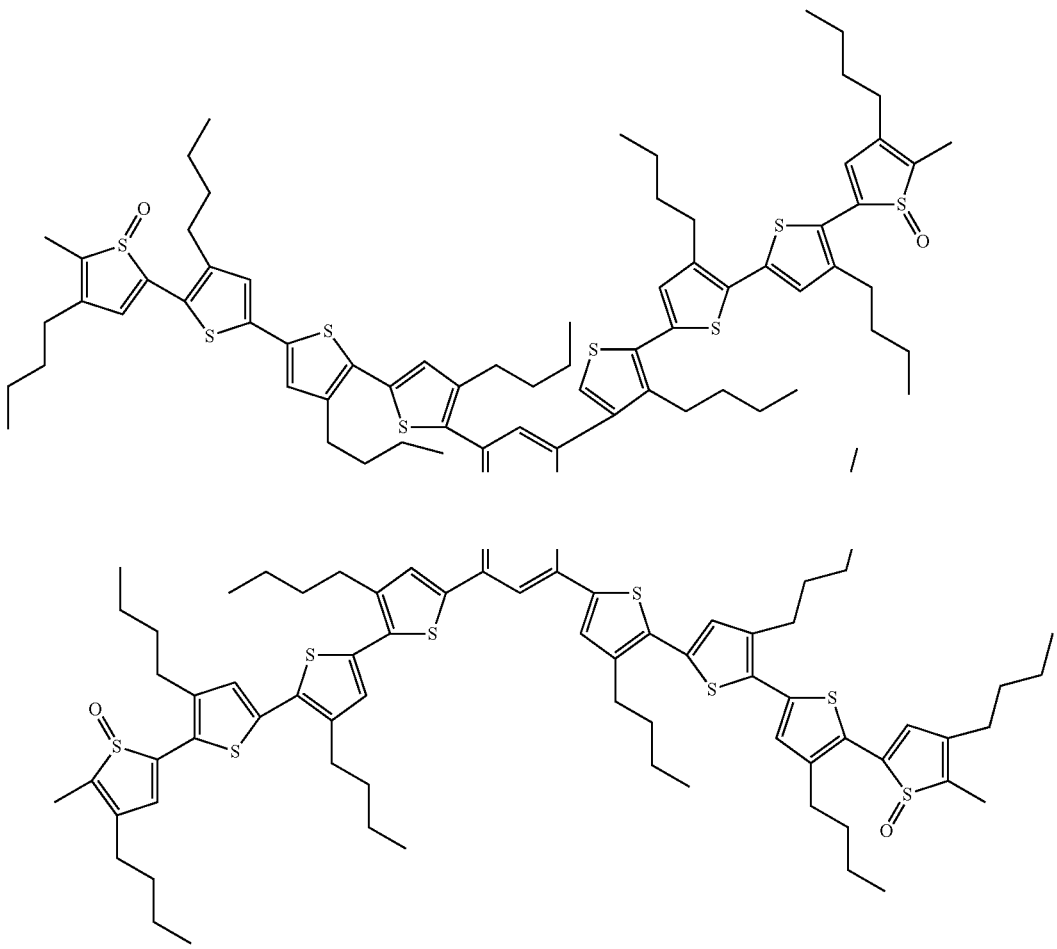

16. The discotic nematic LC material of claim 1, wherein the discotic nematic LC compound is
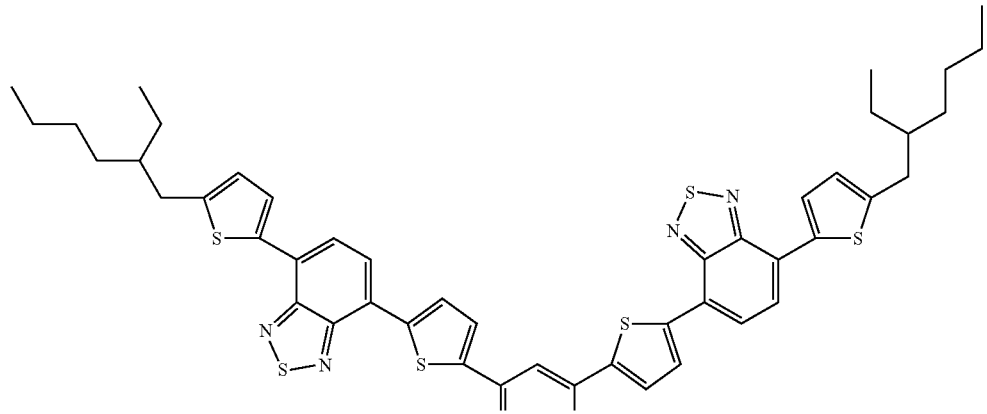
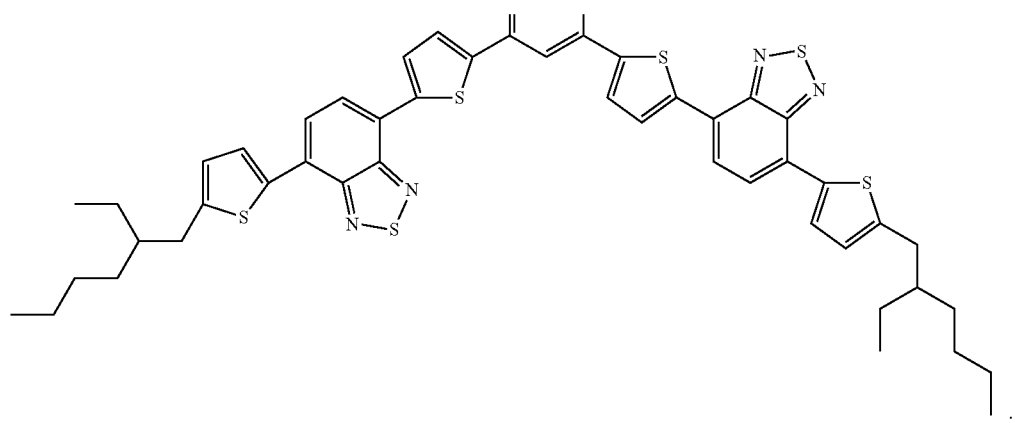
17. The discotic nematic LC material of claim 1, wherein the discotic nematic LC compound is
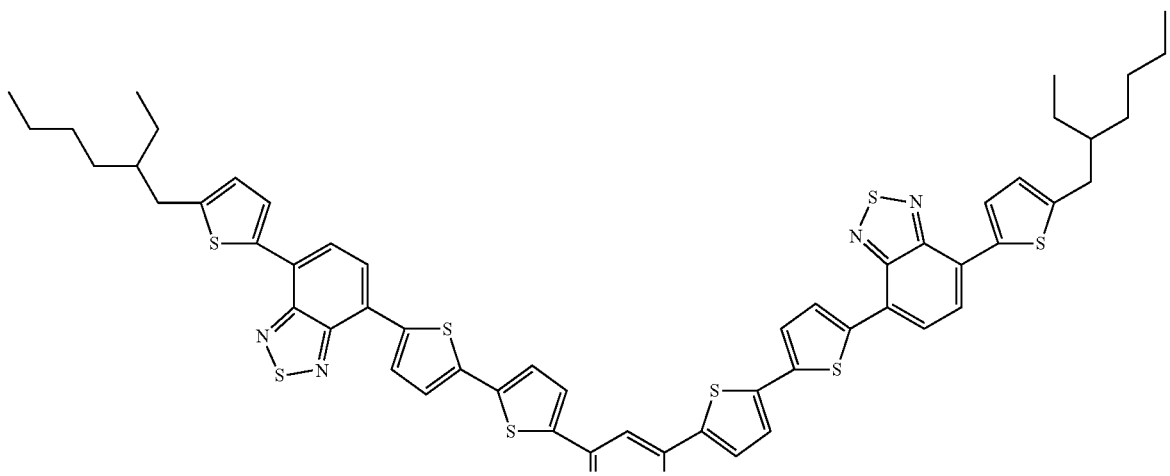

-continued
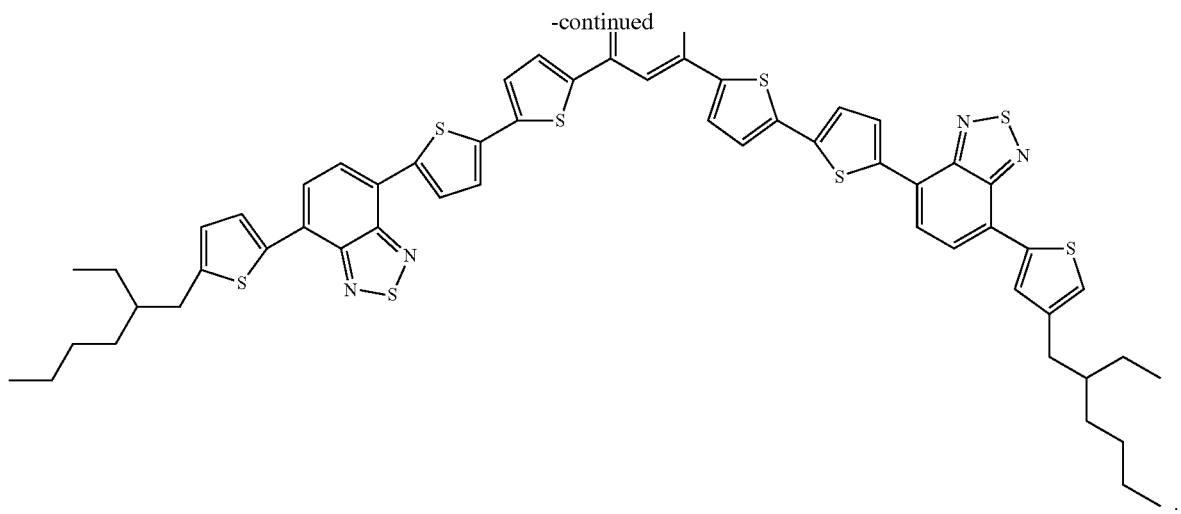
18. The discotic nematic LC material of claim 1, wherein the discotic nematic LC compound is
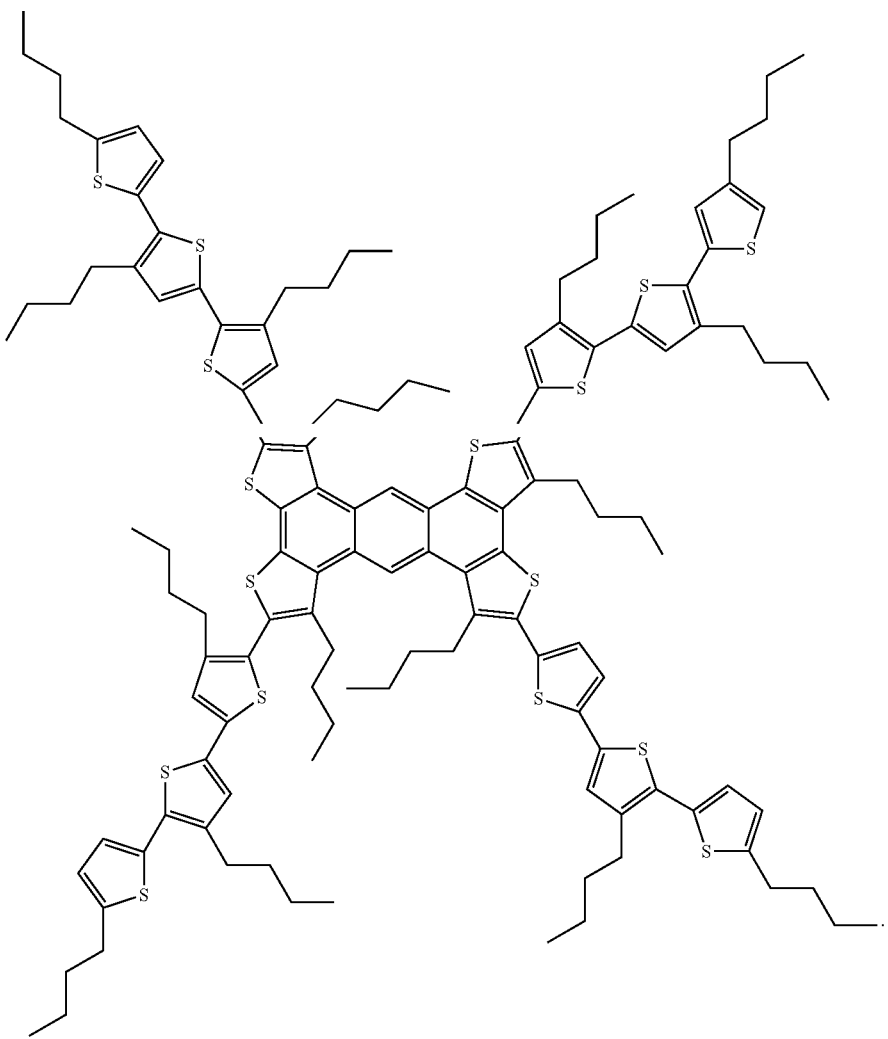

19. The discotic nematic LC material of claim 1, wherein the discotic nematic LC compound is
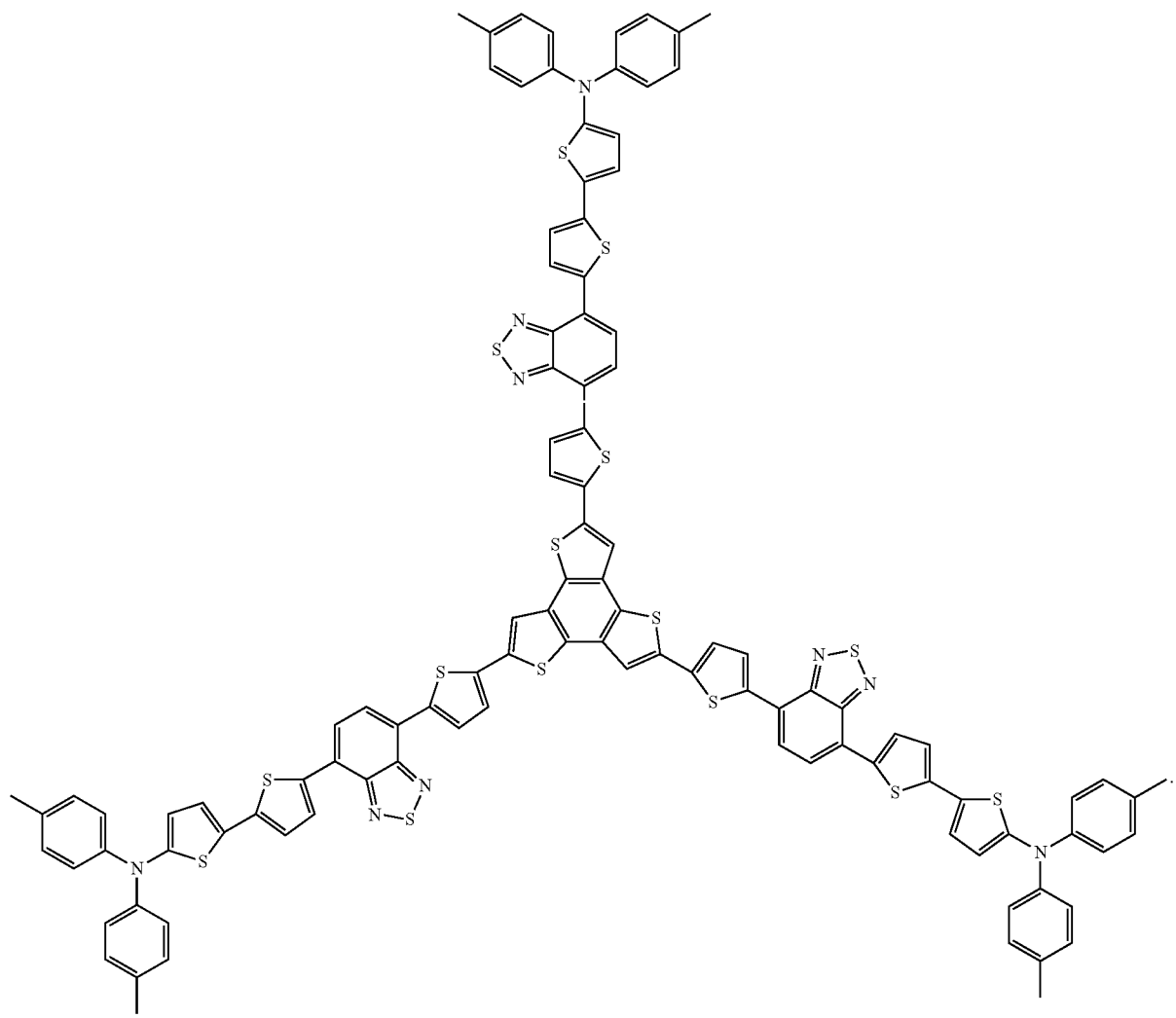

UNITED STATES PATENT AND TRADEMARK OFFICE
CERTIFICATE OF CORRECTION

PATENT NO.       : 7,875,205 B2
APPLICATION NO.  : 12/261742
DATED            : January 25, 2011
INVENTOR(S)      : Mary E. Galvin et al.

Page 1 of 5

It is certified that error appears in the above-identified patent and that said Letters Patent is hereby corrected as shown below:

Column 1,
Line 6, Delete "§102" and insert --§120--

Column 17,
Line 18, delete "sulphoxide" and insert --sulfoxide--

Column 17,
Line 23, delete "menatic" and insert -- nematic--

Columns 17-18, Line 27

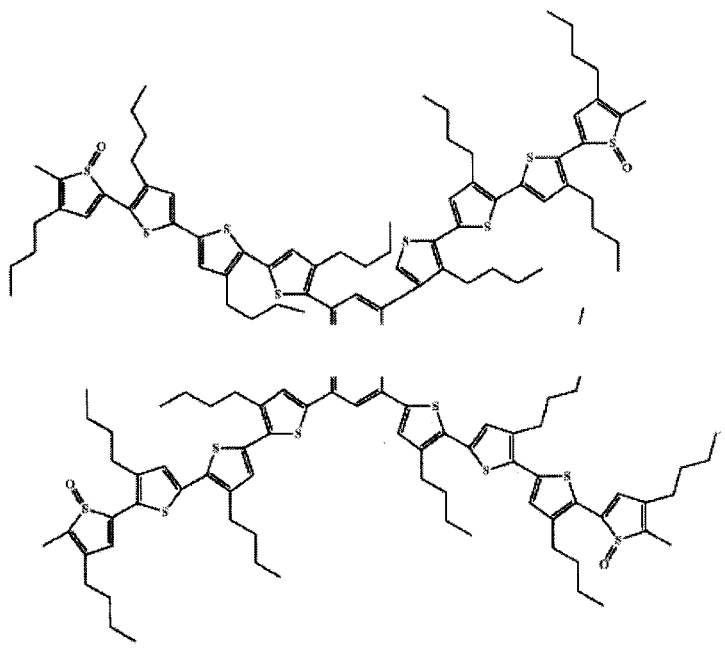

In claim 15, delete " " and

Signed and Sealed this
Third Day of May, 2011

David J. Kappos
*Director of the United States Patent and Trademark Office*

CERTIFICATE OF CORRECTION (continued)
U.S. Pat. No. 7,875,205 B2

Page 2 of 5 insert --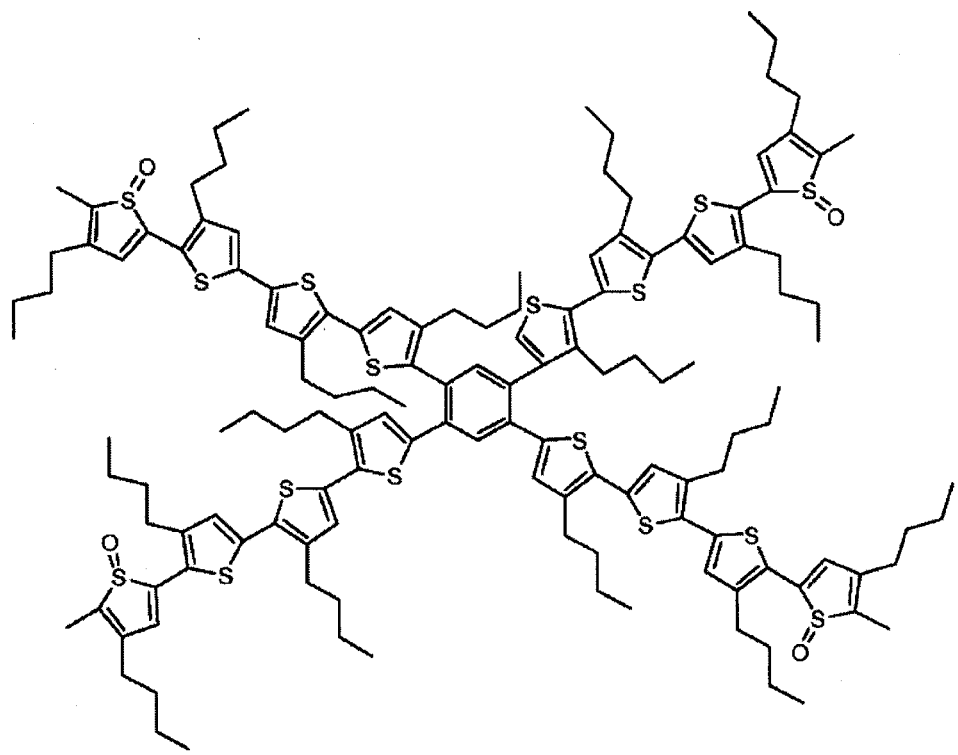--

Columns 19-20, Line 3

In claim 16, delete "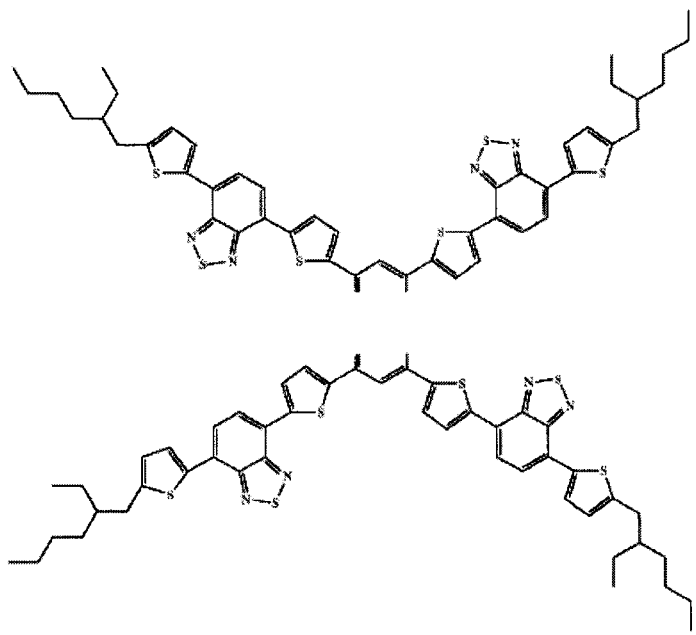" and

CERTIFICATE OF CORRECTION (continued)
U.S. Pat. No. 7,875,205 B2

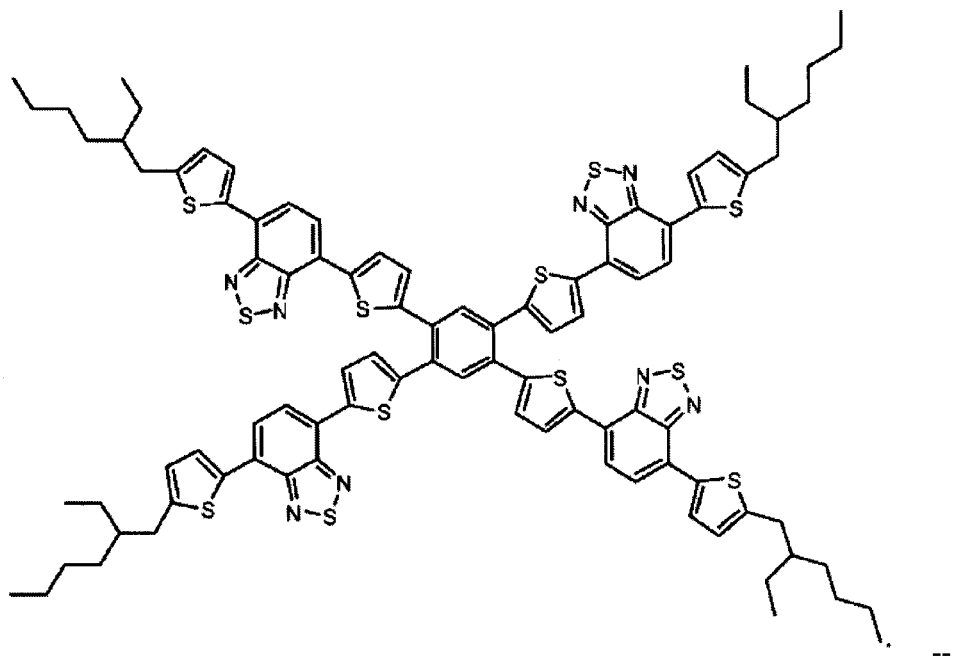

insert --                                                                    . --

Columns 19-20, Line 6

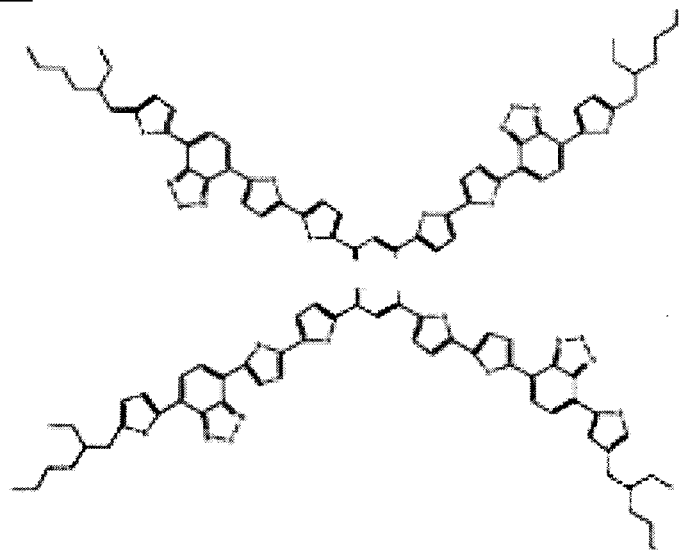

In claim 17, delete "                                                        " and insert -- 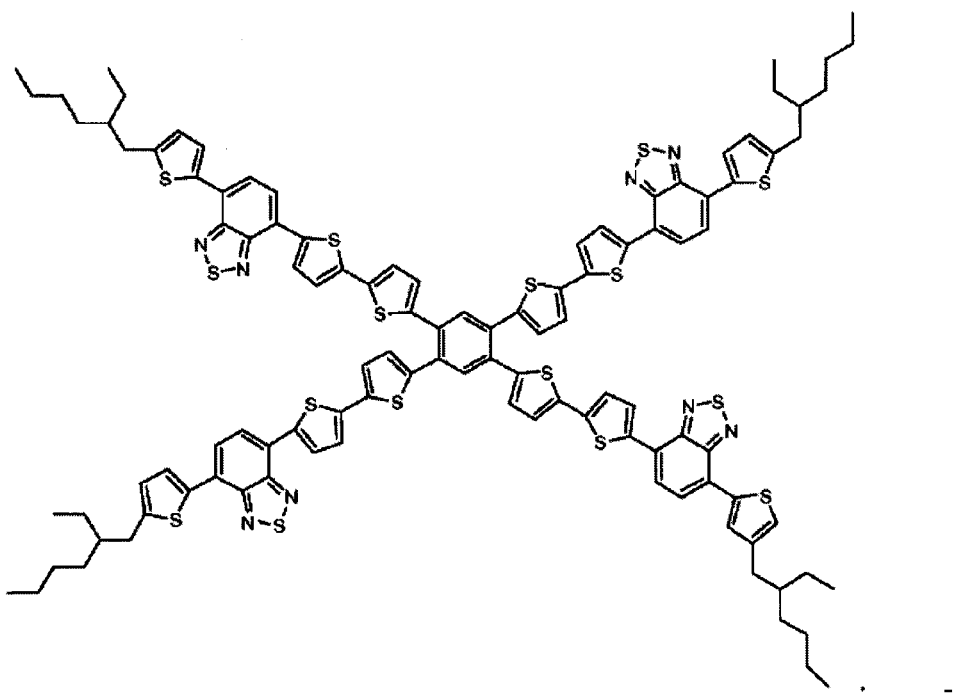 --
Columns 21-22, Line 4
In claim 18, delete " 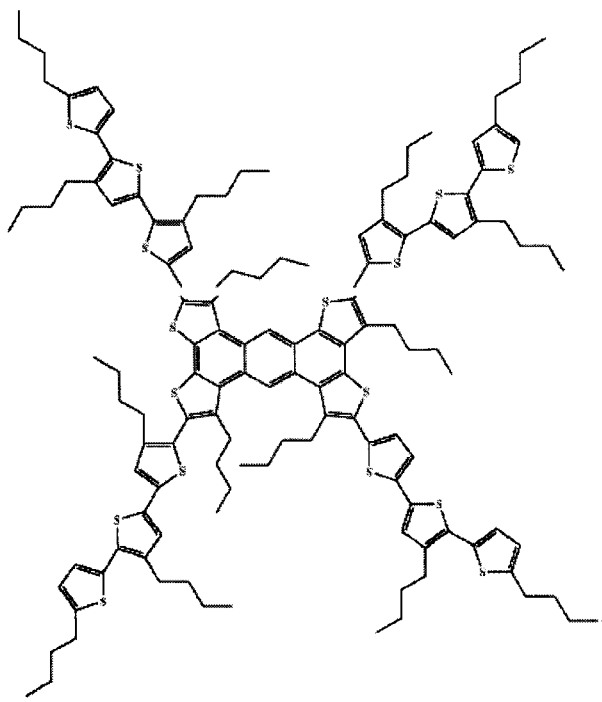 " and

CERTIFICATE OF CORRECTION (continued)
U.S. Pat. No. 7,875,205 B2

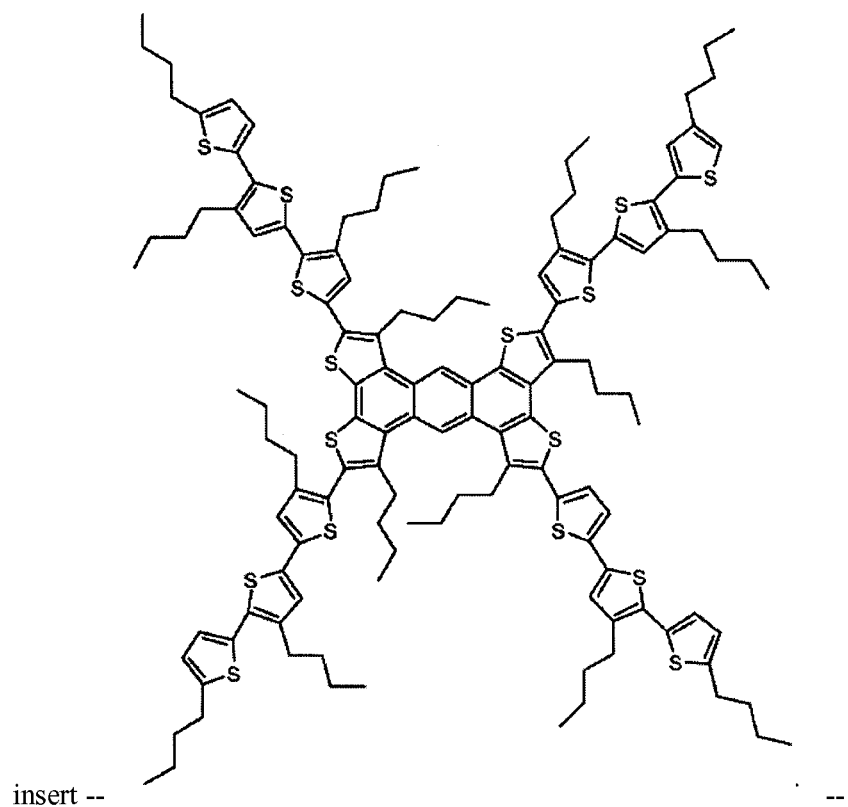

insert --                                                                    . --